United States Patent
Burstein et al.

(10) Patent No.: US 6,462,522 B2
(45) Date of Patent: *Oct. 8, 2002

(54) TRANSISTOR PATTERN FOR VOLTAGE REGULATOR

(75) Inventors: Andrew J. Burstein, Mountain View; Charles Nickel, San Jose, both of CA (US)

(73) Assignee: Volterra Semiconductor Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/892,233

(22) Filed: Jun. 26, 2001

(65) Prior Publication Data

US 2001/0035746 A1 Nov. 1, 2001

Related U.S. Application Data

(63) Continuation of application No. 09/498,297, filed on Feb. 4, 2000, now Pat. No. 6,278,264.

(51) Int. Cl.$^7$ .......................... G05F 1/40; H01L 23/053
(52) U.S. Cl. ...................................... 323/282; 257/700
(58) Field of Search ........................... 323/282, 283, 323/284, 273, 271; 257/700, 675, 724, 345; 174/472; 361/719

(56) References Cited

U.S. PATENT DOCUMENTS

| | | |
|---|---|---|
| 4,074,342 A | 2/1978 | Honn et al. |
| 5,671,121 A | 9/1997 | McMahon |
| 5,777,383 A | 7/1998 | Stager et al. |
| 5,959,442 A | 9/1999 | Hallberg et al. |
| 6,278,264 B1 | 8/2001 | Burstein et al. |

Primary Examiner—Rajnikant B. Patel
(74) Attorney, Agent, or Firm—Fish & Richardson P.C.

(57) ABSTRACT

A voltage regulator with an input terminal and an output terminal has a printed circuit board, a substrate mounted on the printed circuit board, and a first flip-chip type integrated circuit chip mounted on the substrate. The first integrated circuit chip includes a first power switch fabricated therein to alternately couple and decouple the input terminal to the output terminal. A filter is disposed to provide a substantially DC voltage at the output terminal, and a control circuit controls the power switch to maintain the DC voltage substantially constant.

33 Claims, 11 Drawing Sheets

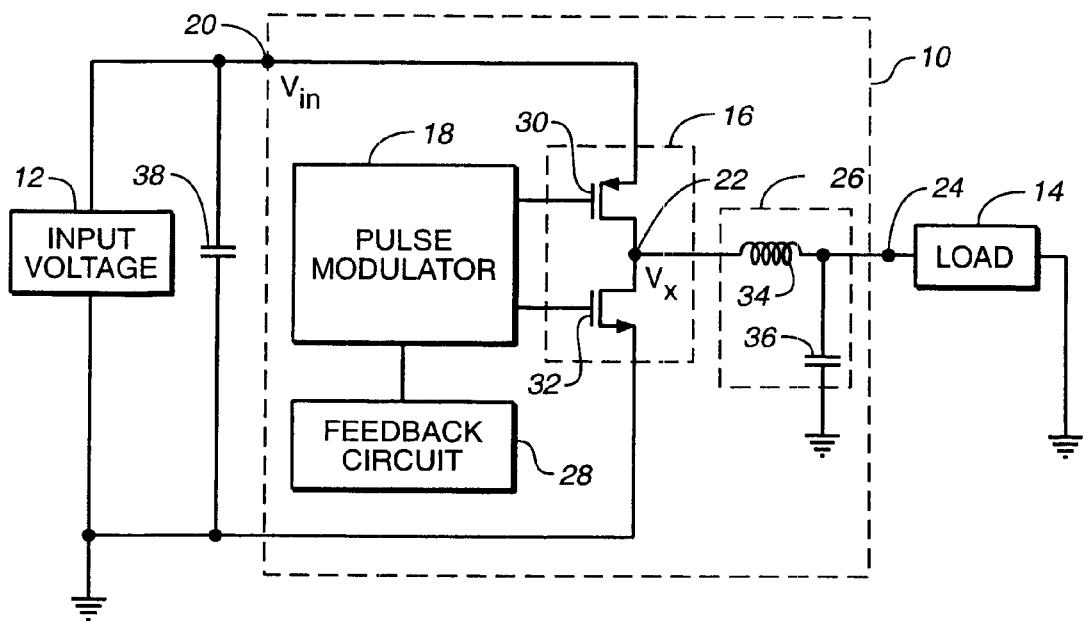
FIG._1
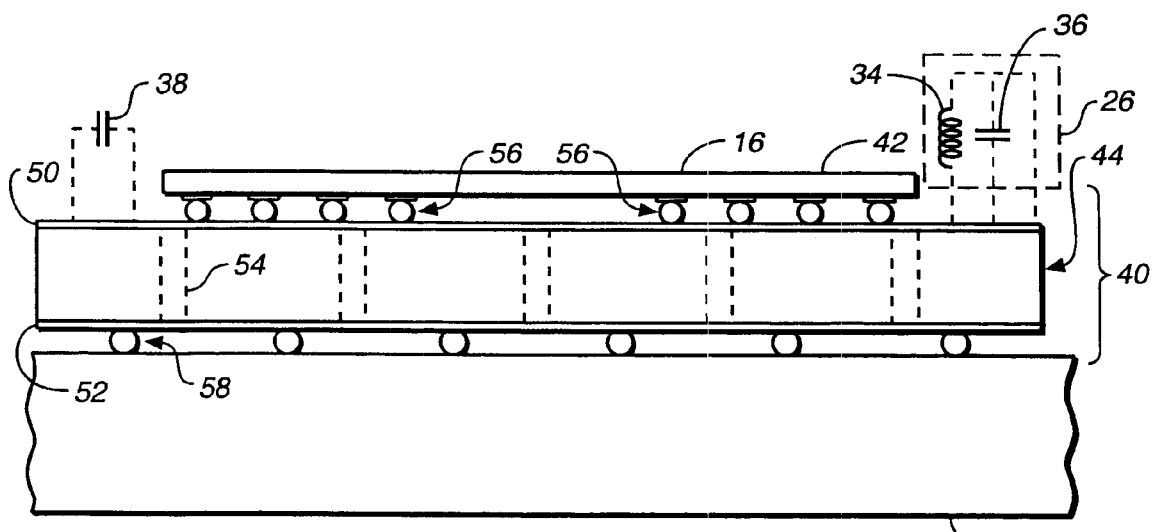
FIG._2

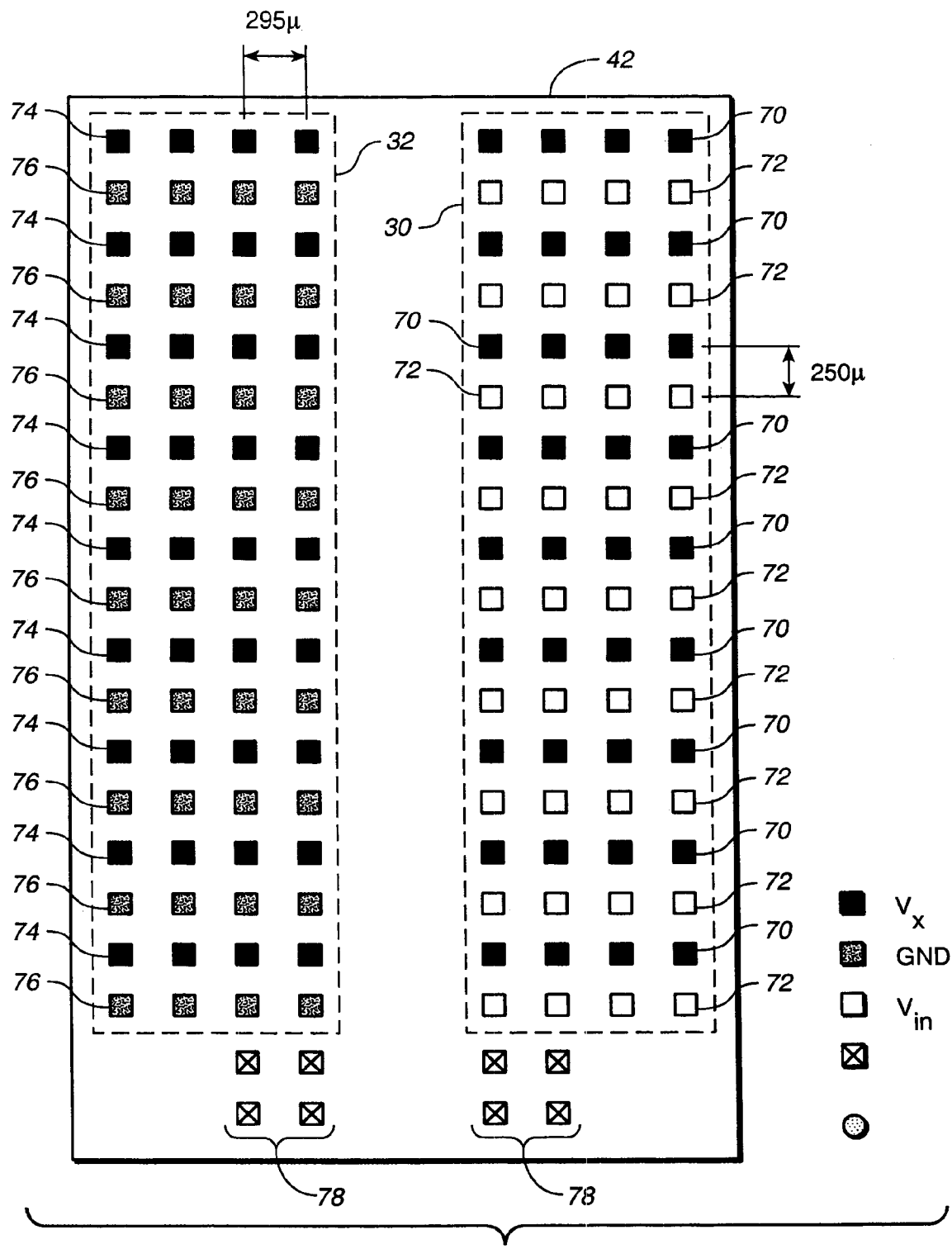
FIG._3A

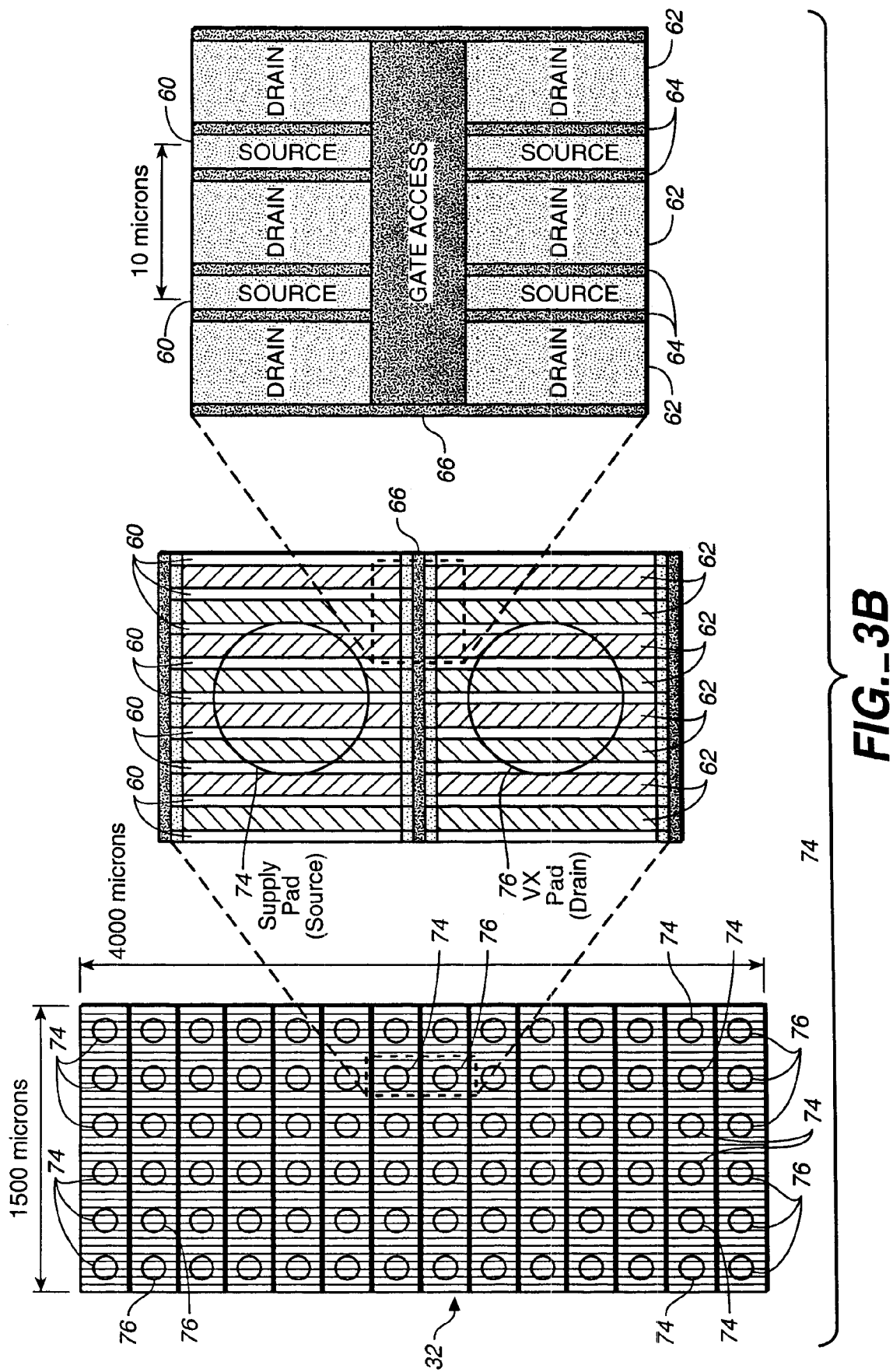
FIG._3B

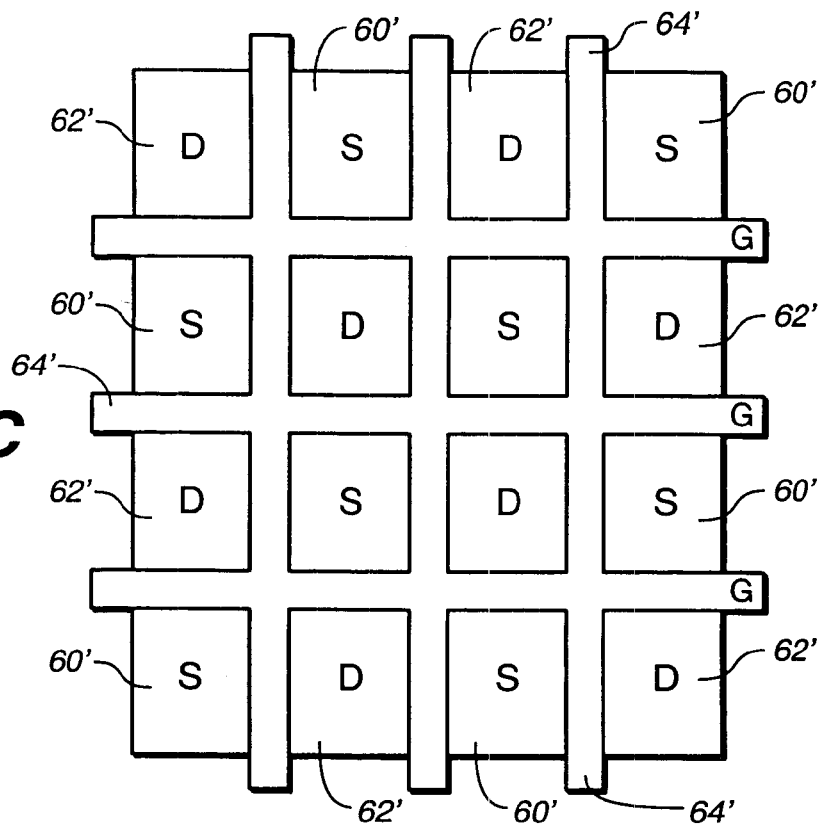
FIG._3C
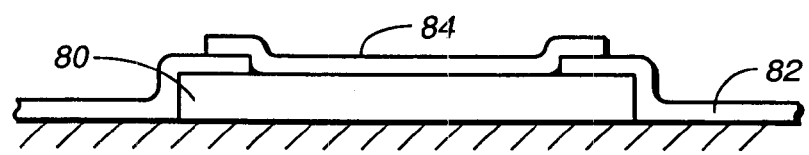
FIG._4A
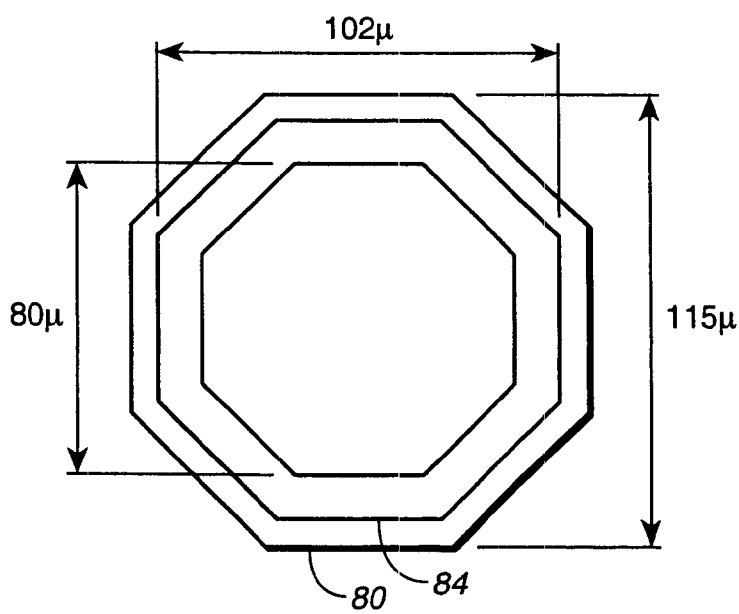
FIG._4B

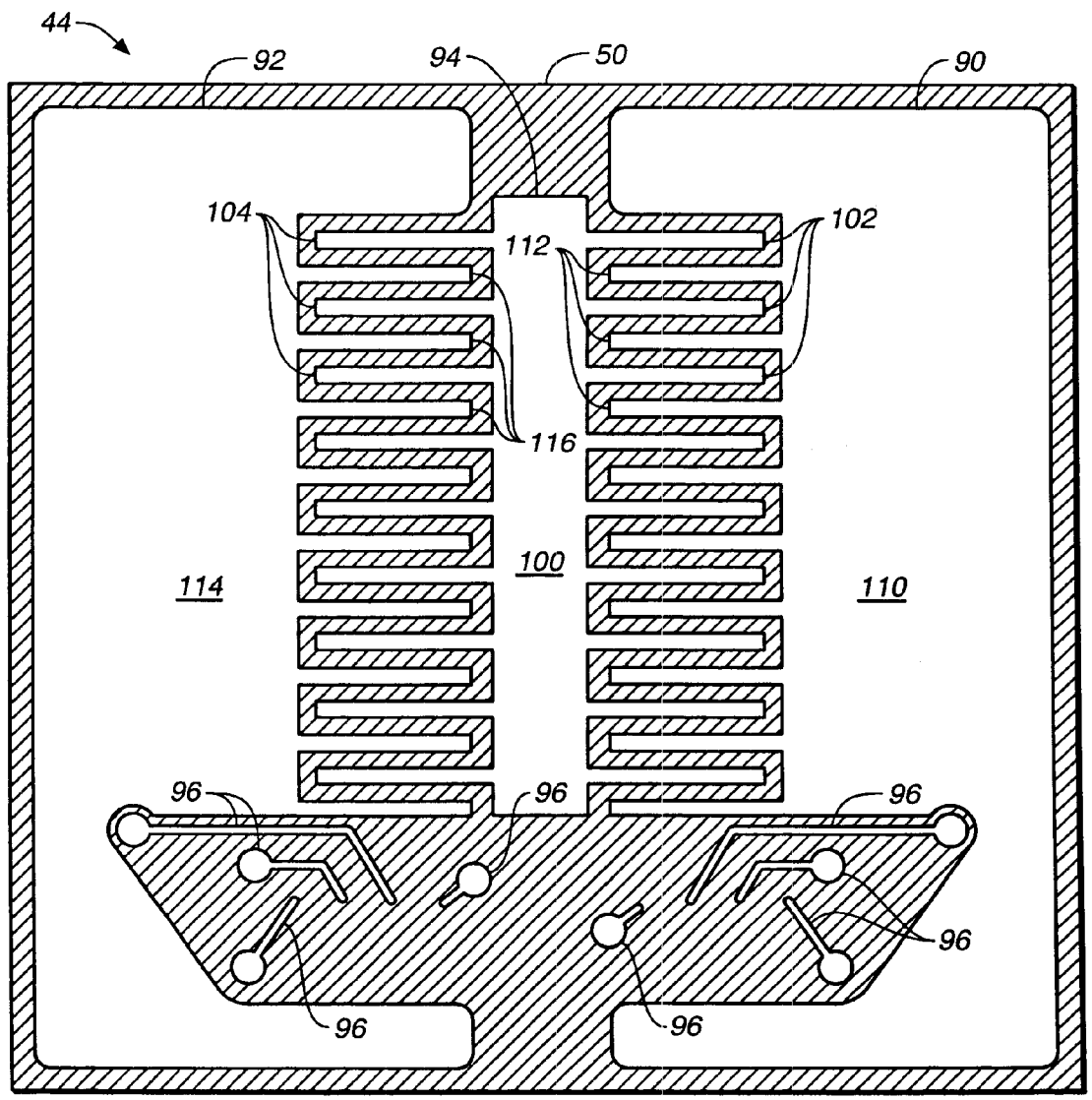
FIG._5

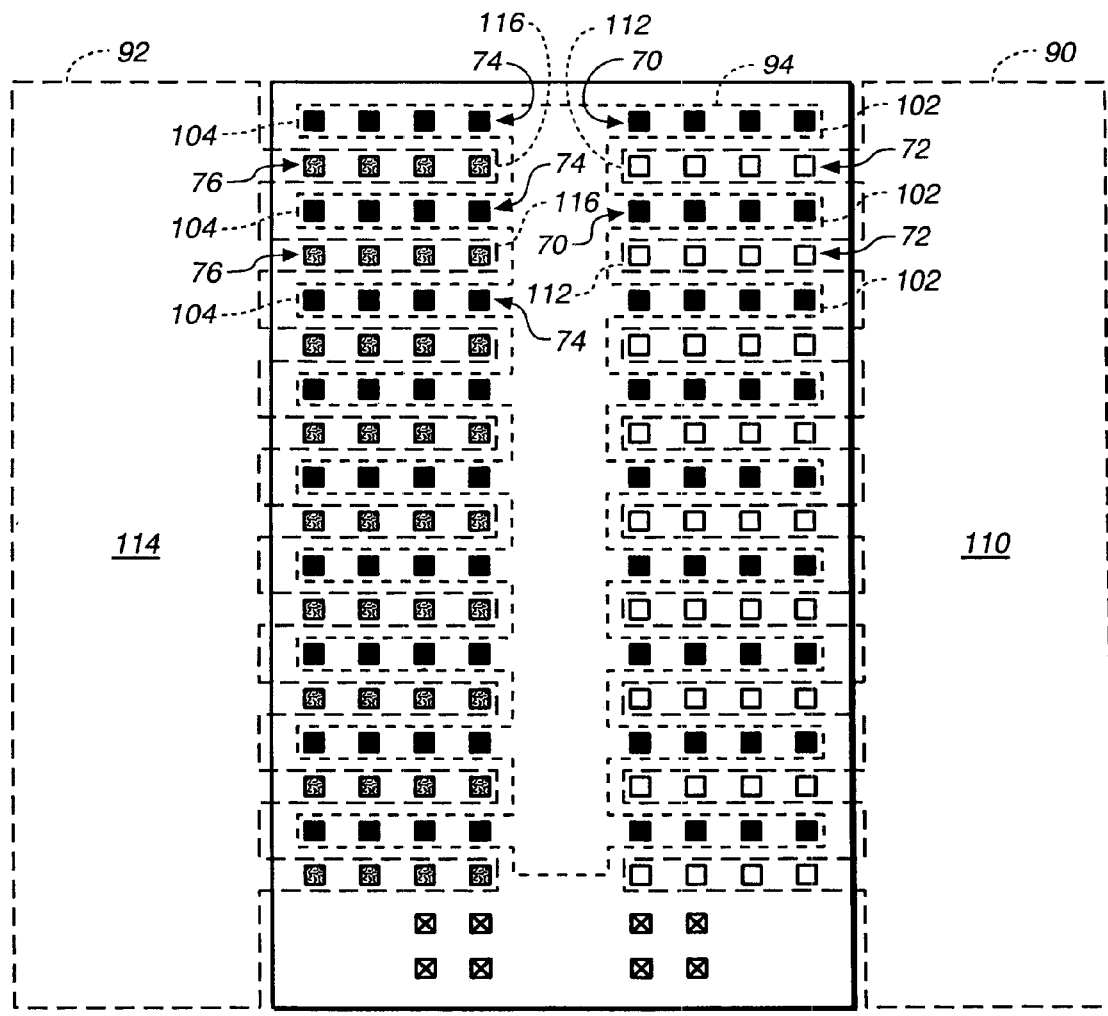
FIG._6

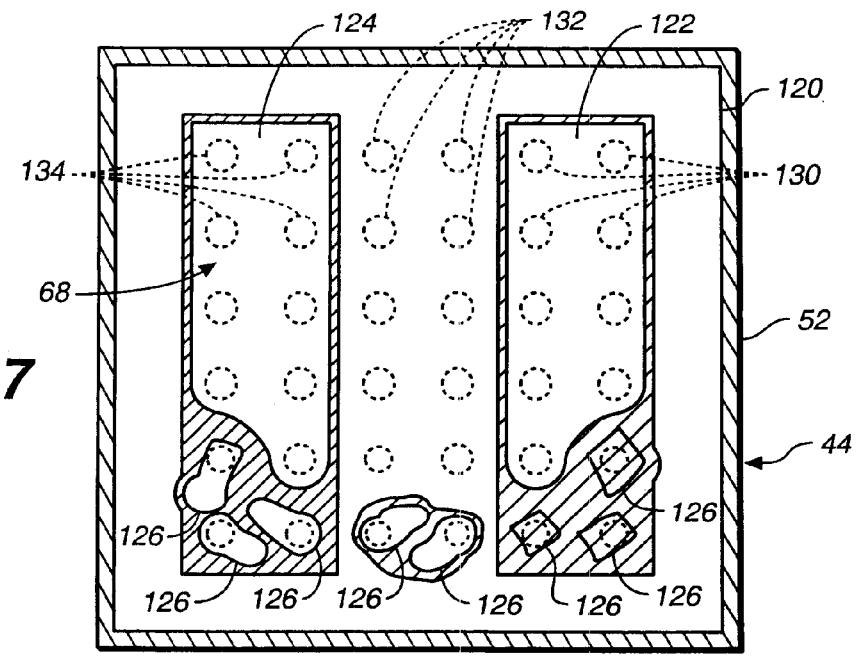
FIG._7
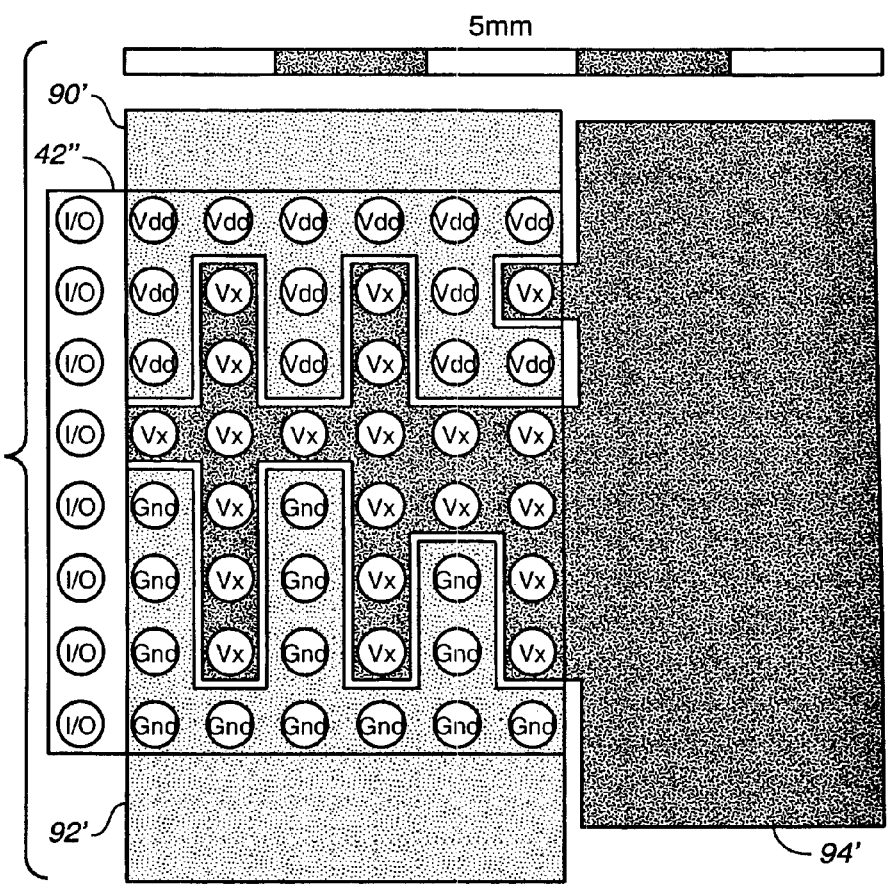
FIG._8A

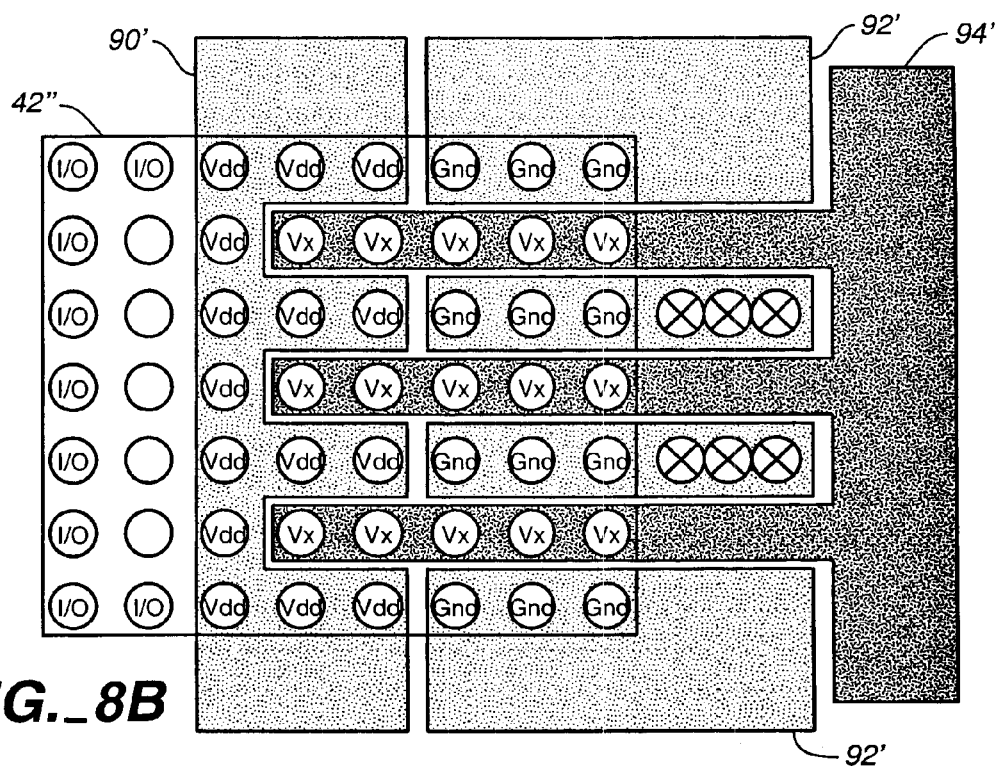
FIG._8B
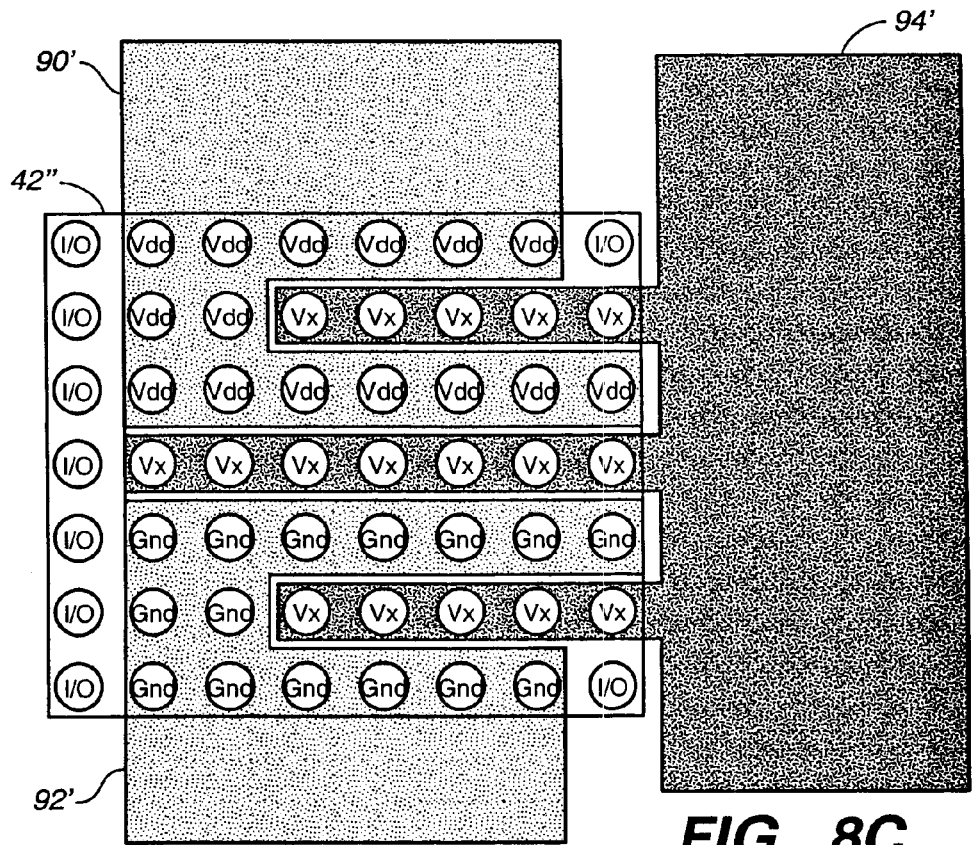
FIG._8C

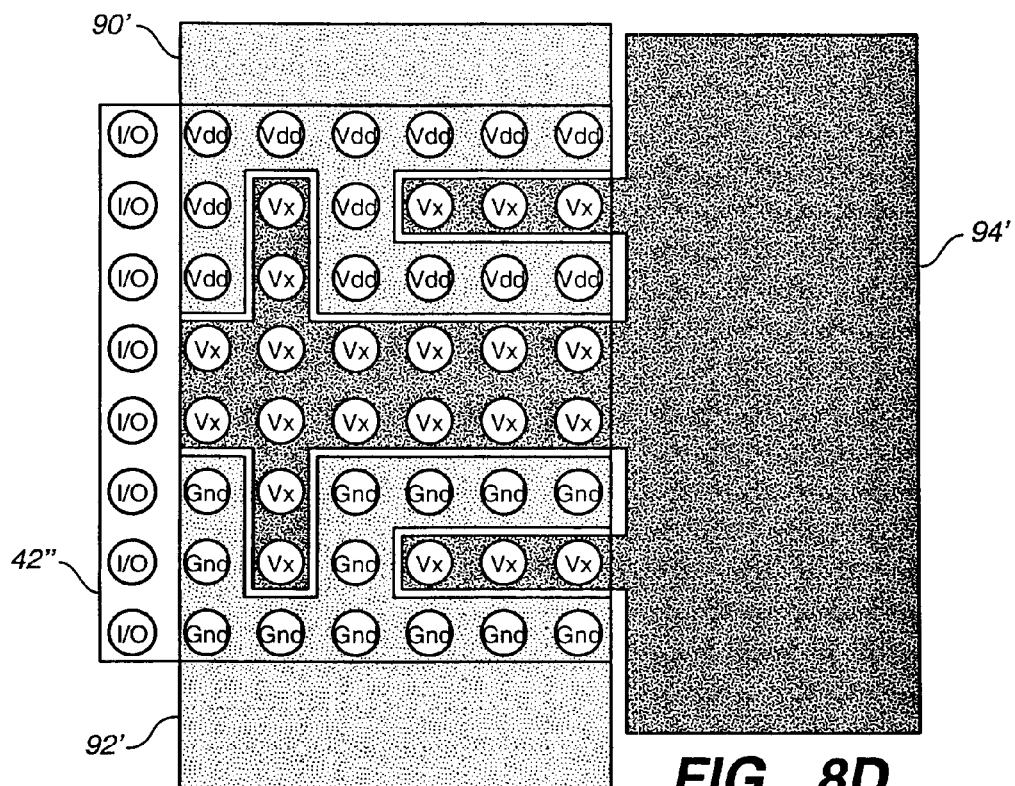
FIG._8D
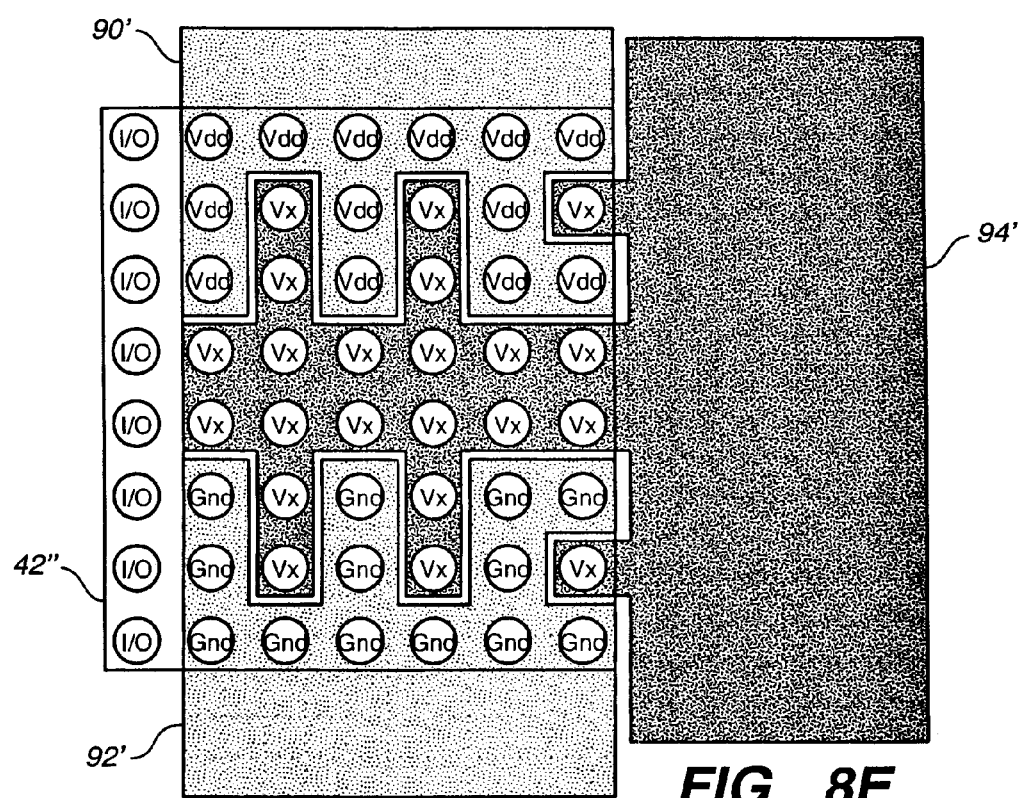
FIG._8E

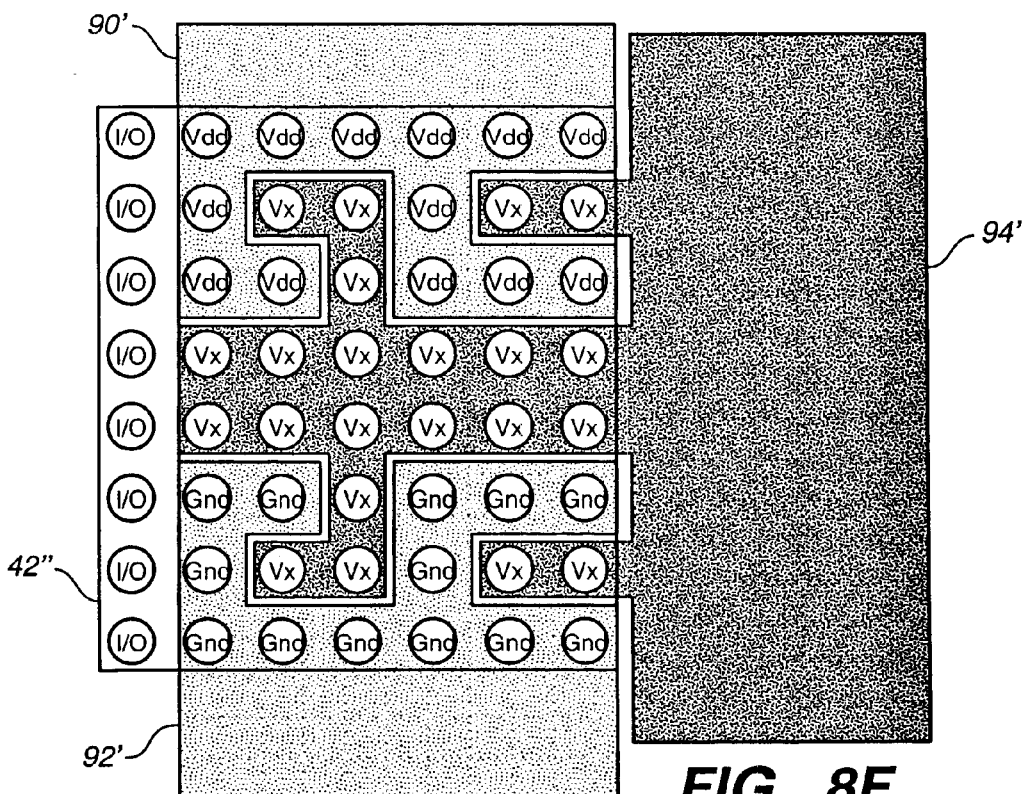
*FIG._8F*
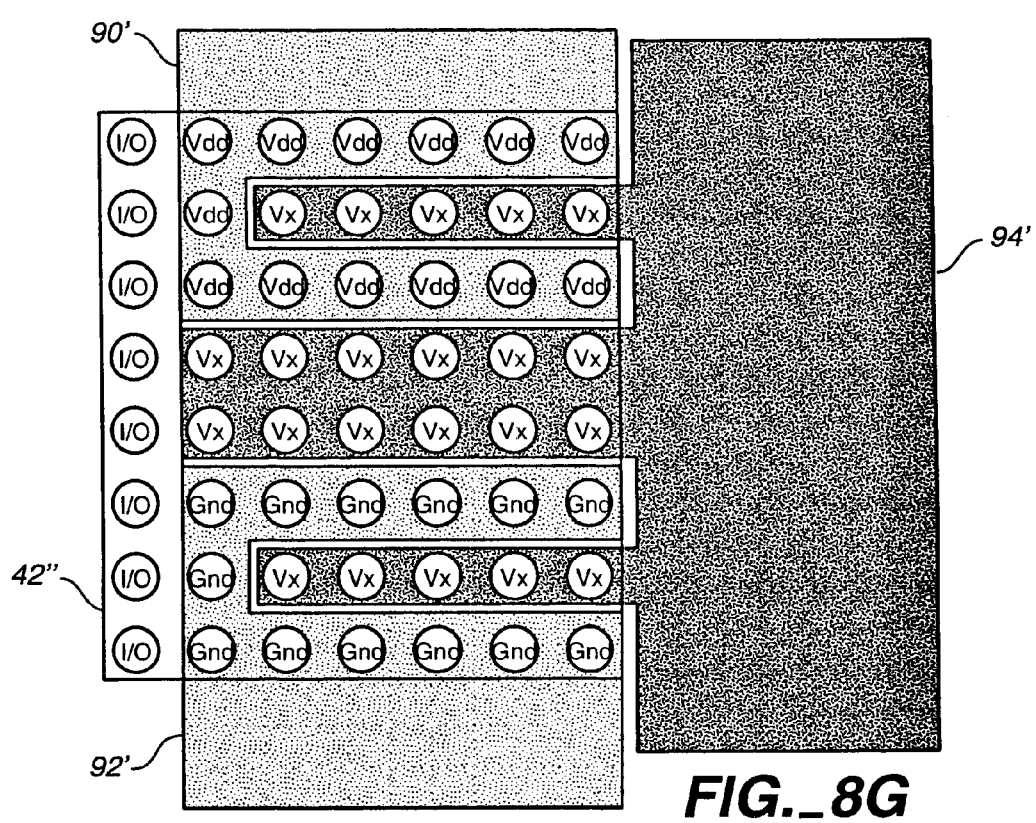
*FIG._8G*

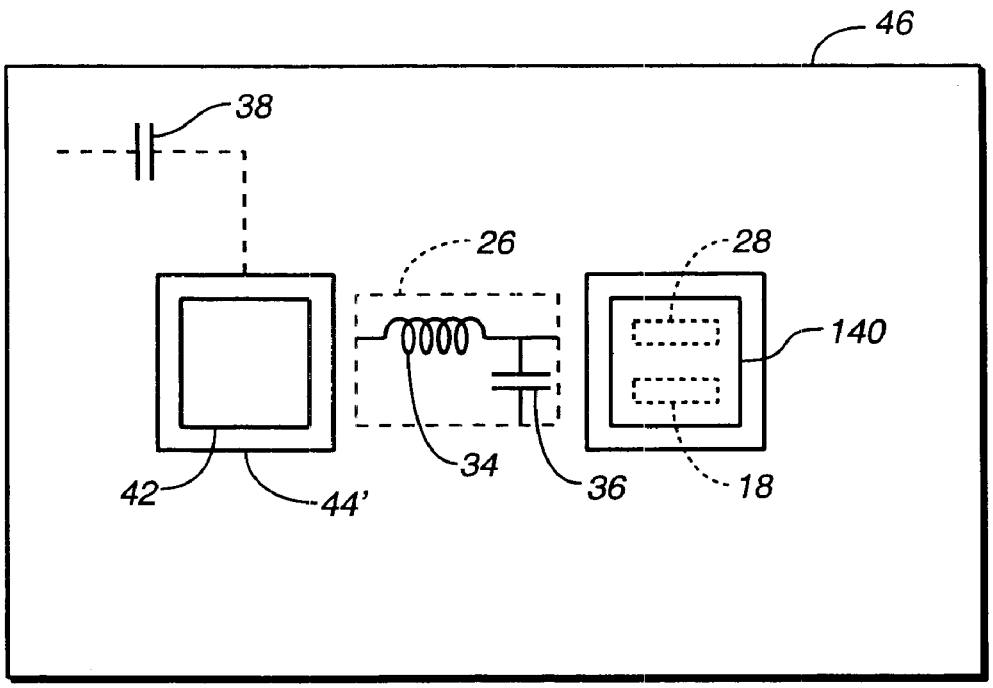
FIG._9
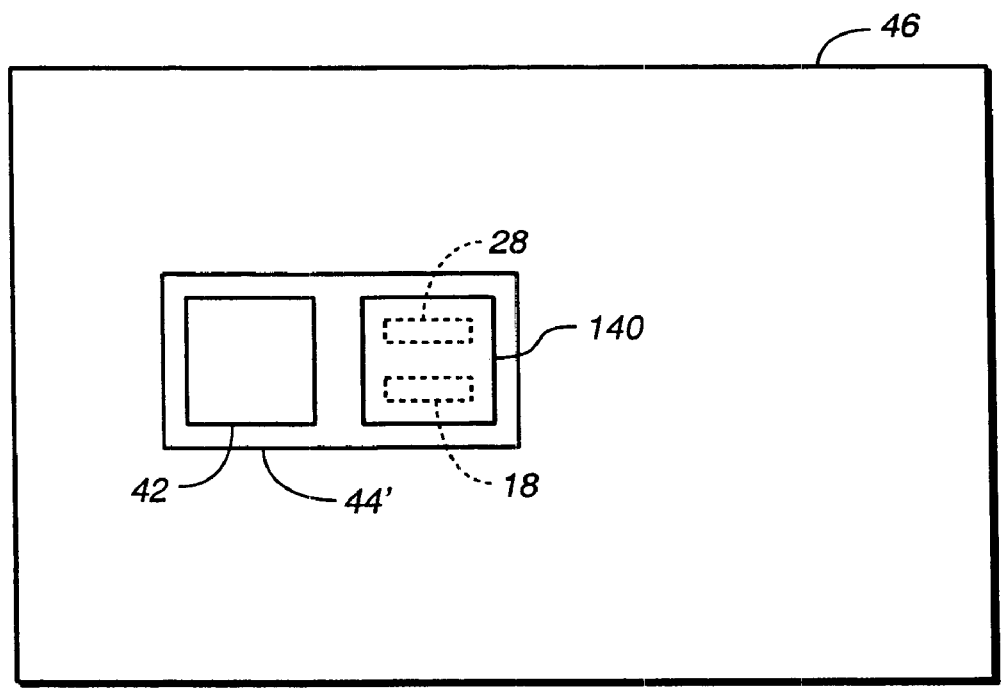
FIG._10

TRANSISTOR PATTERN FOR VOLTAGE REGULATOR

This application is a continuation of U.S. patent application Ser. No. 09/498,297, filed Feb. 4, 2000, now U.S. Pat. No. 6,278,264 the entirety of which is incorporated by reference.

BACKGROUND

The present invention relates generally to voltage regulators, and more particularly to a switching voltage regulator at least partially implemented with flip-chip packaging.

Voltage regulators, such as DC to DC converters, are used to provide stable voltage sources for electronic systems. Efficient DC to DC converters are particularly needed for battery management in low power devices, such as laptop notebooks and cellular phones. Switching voltage regulators (or simply "switching regulators") are known to be an efficient type of DC to DC converter. A switching regulator generates an output voltage by converting an input DC voltage into a high frequency voltage, and filtering the high frequency voltage to generate the output DC voltage. Specifically, the switching regulator includes a switch for alternately coupling and decoupling an input DC voltage source, such as a battery, to a load, such as an integrated circuit. An output filter, typically including an inductor and a capacitor, between the input voltage source and the load filters the output of the switch and thus provides the output DC voltage. The switch is typically controlled by a pulse modulator, such as a pulse width modulator or a pulse frequency modulator, which controls the switch.

Switching regulators are now being fabricated at least partially with integrated circuit techniques. Specifically, some switching regulators are being fabricated in integrated circuit chips with wire bond packaging (in which wires extend from the sides of the chip to the package, and the package has leads that are soldered to a printed circuit board). Unfortunately, one problem with wire bond chips is that they have a large parasitic inductance and resistance.

The parasitic inductance can result in large voltage transients on the integrated circuit. Specifically, although there is an abrupt change in the supply current when switching from the high to low voltage inputs, the current flowing through the parasitic inductor cannot change instantaneously. Thus, some current will continue to flow, causing the voltage on the voltage supply lines to "bounce". If the voltage transients exceed the process limitations of the integrated circuit, there can be damage due to voltage overstress. In addition, if the voltages on the voltage supply lines come too close together or cross, the digital and analog circuitry in the voltage regulator will fail. Furthermore, large voltage transients create noise which can interfere with the normal operation of analog components of the power regulator. Compensating for this noise requires additional circuitry, at the expense of design time, silicon area and power consumption.

The parasitic resistance of the packaging increases energy dissipation, which wastes energy and creates excess heat. This excess heat can degrade circuit performance, and in order to avoid the degraded circuit performance, it is necessary to use expensive heat sinks or cooling systems, or limit the current flowing through the device.

In view of the foregoing, it would be advantageous to develop a switching regulator with reduced parasitic inductance and resistance.

SUMMARY

In one aspect, the invention is directed to a voltage regulator having an input terminal and an output terminal. The voltage regulator has a printed circuit board, a substrate mounted on the printed circuit board, and a first flip-chip type integrated circuit chip mounted on the substrate. The first integrated circuit chip includes a first power switch fabricated therein to alternately couple and decouple the input terminal to the output terminal. A filter is disposed to provide a substantially DC voltage at the output terminal, and a control circuit controls the power switch to maintain the DC voltage substantially constant.

Implementations of the invention may include one or more of the following features. The power switch and filter may form a buck-converter topology. The first integrated circuit chip may be mounted on the substrate with an array of solder bumps, and the substrate may be mounted on the printed circuit board with solder balls. The flip-chip type integrated circuit chip may include a p-type region and an n-type region, and the power switch may include a plurality of p+ regions fabricated in the n-type region, and a plurality of n+ regions fabricated in the p-type region. Alternating p+ regions may be connected to the input terminal and to an intermediate terminal, and alternating n+ regions may be connected to the intermediate terminal and to ground. At least a portion of the control circuit may be fabricated in a second integrated circuit chip electrically coupled to the printed circuit board separately from the first chip. A portion of the control circuit, such as an interpreter to interpret commands from the portion of the control circuit fabricated on the second chip, or a sensor that directs measurements to the portion of the control circuit fabricated on the second chip, may be fabricated on the first chip. The filter can be electrically coupled to the printed circuit board or to the substrate separately from the first chip. The first power switch may intermittently couple an intermediate terminal to the input terminal. The first flip-chip type integrated circuit chip may have a second power switch fabricated therein to alternately couple and decouple the intermediate terminal to ground. The filter may be electrically coupled between the output terminal and the intermediate terminal. The first power switch may include a distributed array of PMOS transistors and the second power switch may include a distributed array of NMOS transistors. A rectifier may connect the intermediate terminal to ground. The rectifier may be connected to the printed circuit board separately from the first chip. The filter may include an inductor or a capacitor electrically coupling the first power switch to the output terminal. The inductor is mounted on the substrate or the printed circuit board. The capacitor may be mounted on the substrate. An input capacitor, mounted on the substrate or printed circuit board, may connect the input terminal to ground.

In another aspect, the invention is directed to an integrated circuit chip with a power switch for a voltage regulator fabricated thereon. The chip includes a substrate having a first plurality of doped regions and a second plurality of doped regions and an array of metalized pads fabricated on a surface of the substrate. The first and second pluralities of doped regions are arranged in a first alternating pattern. The array includes a first plurality of pads and a second plurality of pads, with the first and second pluralities of pads arranged in a second alternating pattern. The first plurality of pads are electrically connected to the first plurality of doped regions and to a first terminal of the voltage regulator, and the second plurality of pads are electrically connected to the second plurality of doped regions and to a second terminal in the voltage regulator.

Implementations of the invention may include one or more of the following features. The second alternating pattern may be a first set of alternating stripes, and the first alternating pattern may be a second set of alternating stripes oriented orthogonally to the first set of alternating stripes. The first and second pluralities of doped regions may be p+ regions formed in an n-type well or substrate. The first terminal may be an input terminal and the second terminal may an intermediate terminal. The first and second pluralities of doped regions may be n+ regions formed in a p-type well or substrate. The first terminal may be a ground terminal and the second terminal is an intermediate terminal. The first plurality of pads may be connected to a first plurality of solder balls and the second plurality of pads may be connected to a second plurality of solder balls interleaved with the first plurality of solder balls across a surface on the chip.

In another aspect, the invention is directed to a power switch for a voltage regulator having an input terminal and an output terminal. The power switch has a PMOS switch fabricated on a chip with a first alternating pattern of source pads and drain pads, an NMOS switch fabricated on the chip with a second alternating pattern of source pads and drain pads, and a substrate having a first signal layer with a first electrode to electrically couple the drain pads of the PMOS and NMOS switches to an intermediate terminal, a second electrode to electrically couple the source pads of the PMOS switch to the input terminal, and a third electrode to electrically couple the source pads of the NMOS switch to ground.

Implementations of the invention may include one or more of the following features. The first and second alternating patterns may be alternating rows. The first electrode may have a body and a first plurality of fingers that extend from the body toward the second electrode, the second electrode may have a body and plurality of fingers that extend toward the first electrode, and the first plurality of fingers may be interdigited with the fingers of the second electrode. The first electrode may have a second plurality of fingers that extend from the body toward the third electrode, the third electrode may have a body and a plurality of fingers that extend toward the first electrode, and the second plurality of fingers may be interdigited with the fingers of the third electrode. Each finger may overlie and be electrically coupled to a row of pads on the chip. The substrate may include a second signal layer formed on an opposite side of the substrate from the first signal layer. Conductive vias through the substrate may electrically connect the first signal layer to the second signal layer. Solder balls may electrically connect the rows of pads to the first, second and third electrodes of the first signal layer.

In another aspect, the invention is directed to a power switch for a voltage regulator. The power switch has a chip having an array of pads formed thereon and a substrate having a signal layer formed thereon. Each pad is connected to a plurality of doped regions to create a distributed array of transistors. The signal layer has a first electrode and a second electrode, the first electrode having a body and a plurality of fingers that extend from the body toward the second electrode, the second electrode having a body and plurality of fingers that extend toward the first electrode. The fingers of the first electrode are interdigited with the fingers of the second electrode and each finger overlies and is electrically coupled to a row of pads on the chip.

In another aspect, the invention is directed to a voltage regulator having a first flip-chip type integrated circuit chip mounted directly on the printed circuit board. The voltage regulator has an input terminal and an output terminal, and the first integrated circuit chip including a first power switch fabricated therein to alternately couple and decouple the input terminal to the output terminal. A filter is disposed to provide a substantially DC voltage at the output terminal, and a control circuit controls the power switch to maintain the DC voltage substantially constant.

Advantages of the invention may include the following. Device reliability, efficiency and temperature control are improved. The power switch package has a low parasitic inductance. Therefore, the package places less stress on the integrated circuit, is less likely to cause the voltages on the inputs to approach too closely, and generates less noise. The power switch package also has a low parasitic resistance, thus reducing excess heat and minimizing the loss of current flowing through the power switch package. Reducing the resistance reduces the amount of power dissipated, thereby making the switching regulator more efficient. The switching regulator can be fabricated in a flip-chip package. The package also permits the circuit density on the chip to be increased, thereby permitting lower cost, smaller area, and more complex chips.

BRIEF DESCRIPTION OF THE DRAWINGS

FIG. 1 is a block diagram of a switching regulator.

FIG. 2 is a schematic side view of a flip-chip package from the switching regulator of FIG. 1.

FIG. 3A is a schematic plan view of a power switch fabricated on a flip-chip according to the invention.

FIG. 3B is an enlarged view illustrating the distributed array of parallel transistor used in the power switch of FIG. 3A.

FIG. 3C is a schematic plan view of a distributed transistor fabricated in a checkerboard pattern.

FIG. 4A is a schematic side view of a pad from the flip-chip of FIG. 3A.

FIG. 4B is a schematic plan view of the pad of FIG. 4A.

FIG. 5 is a schematic plan view of the top surface of the substrate nearer to the power switch chip.

FIG. 6 is a schematic illustration of the alignment of the flip-chip to the top surface of the substrate.

FIG. 7 is a schematic plan view of the bottom surface of the substrate farther from the power switch chip.

FIGS. 8A–8G are schematic plan views of several configurations for the drain and source pads and the overlying electrodes to enable direct mounting of a flip chip to a printed circuit board.

FIG. 9 is a schematic plan view of a switching regulator in which two. IC chips are connected separately to a printed circuit board.

FIG. 10 is a schematic plan view of a switching regulator in which two IC chips are connected by the same substrate to a printed circuit board.

DETAILED DESCRIPTION

Referring to FIG. 1, an implementation of a switching regulator 10 is coupled to a DC input voltage source 12, such as a battery, by an input terminal 20. The switching regulator 10 is also coupled to a load 14, such as an integrated circuit, by an output terminal 24. The switching regulator 10 serves as a DC-to-DC converter between the input terminal 20 and the output terminal 24. The switching regulator 10 includes a switching circuit 16 which serves as a power switch for alternately coupling and decoupling the input terminal 20 to an intermediate terminal 22. The switching circuit 16 includes a rectifier, such as a switch or diode, coupling the intermediate terminal 22 to ground. Specifically, the switching circuit 16 and the output filter 26 may be configured in a buck converter topology with a first transistor 30 having a source connected to the input terminal 20 and a drain connected to the intermediate terminal 22 and a second transistor 32 having a source connected to ground and a drain connected to the intermediate terminal 22. The first transistor 30 may be a P-type MOS (PMOS) device, whereas the second transistor 32 may be an N-type MOS (NMOS) device. The switching regulator 10 may also include an input capacitor 38 connecting the input terminal 22 to ground.

The switching regulator also includes a controller assembly with a pulse modulator 18 for controlling the operation of the switching circuit 16. The pulse modulator 18 causes the switching circuit 16 to generate an intermediate voltage having a rectangular waveform at the intermediate terminal 22. Although the pulse modulator 18 and the switching circuit 16 are illustrated and described below as a pulse width modulator, the invention is also applicable to various pulse frequency modulation schemes.

The intermediate terminal 22 is coupled to the output terminal 24 by an output filter 26. The output filter 26 converts the rectangular waveform of the intermediate voltage at the intermediate terminal 22 into a substantially DC output voltage at the output terminal 24. Specifically, in a buck-converter topology, the output filter 26 includes an inductor 34 connected between the intermediate terminal 22 and the output terminal 24 and a capacitor 36 connected in parallel with the load 14. During a PMOS conduction period, the voltage source 12 supplies energy to the load 14 and the inductor 34 via the first transistor 30. On the other hand, during an NMOS conduction period, the energy is supplied by the inductor 34. The resulting output voltage $V_{out}$ is a substantially DC voltage. Although the switching circuit 16 and the output filter 26 are illustrated in a buck converter topology, the invention is also applicable to other switching voltage regulator topologies, such as a boost converter or a buck-boost converter topology.

The output voltage is regulated, or maintained at a substantially constant level, by a feedback loop in the controller assembly that includes a feedback circuit 28. The feedback circuit 28 includes circuitry which measures the output voltage and/or the current passing through the output terminal. The measured voltage and current are used to control the pulse modulator 18 so that the output voltage at the output terminal 24 remains substantially constant.

Referring to FIG. 2, the switching circuit 16 can be fabricated in a flip-chip package 40 that includes an integrated circuit chip 42 and a substrate 44. The flip-chip package 40 is attached to a printed circuit board (PCB) 46 on which the other components of the power regulator, such as the output filter and feedback circuit, can be mounted. An implementation of the substrate 44 includes a metallized top signal layer 50 which faces the chip 42, a metallized bottom signal layer 52 on the side of the substrate farther from the chip 42, and vias 54 (shown in phantom) that connect the top signal layer 50 to the bottom signal layer 52. The power switch chip 42 is connected to the top signal layer 50 of the substrate 44 by solder bumps 56 which may be silver, aluminum, copper, brass, an alloy of lead and tin, or another metal or metal alloy. The bottom signal layer 52 of the substrate 44 is connected to the printed circuit board 46 by additional solder balls 58. Of course, the substrate 44 could include three or more signal layers.

As shown in FIGS. 3A and 3B, each switch in the switching circuit 16 on IC chip 42 is fabricated as a distributed array of parallel transistors. Each switch includes multiple doped regions arranged to form parallel stripes, and alternating stripes are connected to form the source and drain regions of the distributed transistor. Specifically, the NMOS transistor 32 includes alternating stripes of n-doped source regions 60 and drain regions 62 in a p-type well or substrate. The PMOS transistor array 30 will be constructed similarly, with alternating stripes of p-doped source regions and drain regions in an n-type well or substrate. Each pair of source and drain stripes is separated by a gate stripe 64. The IC chip can include two or more metalization layers, e.g., three layers, formed over the semiconductor substrate to carry current from the doped regions to the electrode pads on the surface of the chip.

In another implementation, as shown in FIG. 3C, the distributed transistor can be fabricated in a regular array. Specifically, the NMOS transistor 32 includes rectangular n-doped source regions 60' and drain regions 62' laid out in a checkerboard pattern in a p-type well or substrate. The PMOS transistor array 30 will be constructed similarly, with alternating rectangular p-doped source regions and drain regions in an n-type well or substrate. A grid-like gate 64' separates each pair of source and drain regions. Unillustrated metalization layers formed over the semiconductor substrate can carry current from the doped regions to the electrode pads on the surface of the chip.

As shown in FIG. 3A, on the surface of the chip, overlying the buried array of distributed transistors, is an array of drain pads and source pads. Specifically, in one implementation, the PMOS switch includes a regular array of source pads 70 and drain pads 72, with alternating rows of the pads connected by the unillustrated metalization layers to the source regions and drain regions, respectively, of the distributed transistor. Similarly, the NMOS switch includes a regular array of source pads 74 and drain pads 76, with alternating rows of the pads connected by unillustrated metalization layers to the source regions 60 and drain regions 62, respectively. The rows of source and drain pads may be oriented orthogonally to the stripes of source and drain regions in the chip. A possible advantage of this implementation is reduced impedance. Alternatively, the array of distributed transistors can be configured so that the transistors are not direct beneath the drain pads and source pads.

A set of control pads 78 can be located near an edge of the chip 42. The control pads 78 can be connected to gate access lines 66 which are connected to the gate stripes, or the control pads may be connected to unillustrated circuitry on the IC chip 42 which interprets commands generated by the off-chip controller 18 and, in response to the commands, controls the gate access lines. Additional unillustrated circuitry on the IC chip may measure a characteristic of the switching circuit, e.g., the current flowing through the PMOS transistor array 30 and NMOS transistor array 32, and pass the measurement back to the rest of the control circuitry via the control pads 78.

When the flip-chip 42 is connected to the rest of the switching voltage regulator on the printed circuit board 46, the drain pads 70 and 74 will be connected to the intermediate terminal 22, the source pads 72 in the PMOS transistor 30 will be connected to the input terminal 20, and the source pads in the NMOS transistor 32 will be connected to ground. A possible advantage of this distributed array configuration is that current only needs to flow the short distance between adjacent rows of pads, rather than the entire length of the transistor, thereby lowering metal resistance.

Each row of drain or source pads 70, 72, 74, 76 may contain a number of individual pads, e.g., four pads (as shown in FIG. 3A) to six pad (as shown in FIG. 3B). The center-to-center distance between each pad in a row may be about 300 microns, and the center-to-center distance between each row of pads may be about 250 microns. As shown in FIG. 4A, each pad includes a final metal layer 80, such as aluminum, a nitride passivation layer 82, and an under-bump metalization (UBM) layer 84. As shown in FIG. 4B, although the pads are illustrated in FIG. 3 as square, each pad may be octagonal, or some other shape that is appropriate to maximize circuit performance for a particular application. The UBM layer 84 can have an edge-to-edge distance of about 100 microns, and the final metal layer 80 can having an edge-to-edge distance of about 115 microns.

As previously discussed, the substrate 44 transfers signals from the chip 42 to the printed circuit board 46. As shown in FIG. 5, the top signal layer 50 of the substrate 44 includes an input voltage electrode plane 90, a ground electrode plane 92, and an intermediate voltage electrode plane 94. The intermediate voltage electrode 94 includes a central connecting bar 100, a set of electrode fingers 102 that extend off the central connecting bar 100 toward input voltage electrode 90, and a set of electrode fingers 104 that extend off the central connecting bar 100 toward the ground electrode 92. The input voltage electrode 90 includes a main electrode body 110 and a set of electrode fingers 112 that extend from the main body 110 toward the intermediate voltage electrode 94 and are interdigited with the electrode fingers 102. Similarly, the ground electrode 92 includes a main electrode body 114 and a set of electrode fingers 116 that extend from the main body 114 toward the intermediate voltage electrode 94 and are interdigited with the electrode fingers 104.

Referring to FIG. 6, each row of pads on the flip-chip 42 is aligned with one of the electrode fingers in the top signal layer 50. Specifically, each drain pad 70 in the PMOS transistor 30 is aligned with an electrode finger 102 of intermediate voltage electrode 94, and each source pad 72 in the PMOS transistor 30 is aligned with an electrode finger 112 of the input voltage electrode 90. Similarly, each drain pad 74 in the NMOS transistor 32 is aligned with an electrode finger 104 of intermediate voltage electrode 94, and each source pad 76 in the NMOS transistor 32 is aligned with an electrode finger 116 of the ground electrode 92. Small control electrodes 96 are aligned with the control pads 78.

Once assembled, each pad is electrically connected by a solder bump to the appropriate electrode of the top signal layer 50. In general, increasing the number of solder bumps lowers the impedance of the connection between the flip chip and the substrate. The interleaved structure of the electrode fingers on the signal layer 50 and the alternating rows of drain and source pads on the flip-chip 42 provides a very simple configuration that does not require hundreds of individual interconnects. It also provides a very short current path on the chip 42 to each part of the power transistors, thereby reducing on-chip metal resistance and power losses. In addition, the configuration permits the efficient use of field-effect transistors in both the interior and periphery of the chip.

As shown in FIG. 7, the bottom signal layer 52 of the substrate 44 includes an intermediate voltage electrode 120, an input voltage electrode 122, and a ground electrode 124. Conductive vias 54 (see FIG. 2) connect associated electrodes on the top and bottom signal layers, so that the bottom intermediate voltage electrode 120 is connected to the top intermediate voltage electrode 94, the bottom input electrode 122 is connected to the top input electrode 90, and the bottom ground electrode 124 is connected to the top ground electrode 92. Additional vias connect the top and bottom control electrodes 96 and 126.

As previously mentioned, solder bumps 58 (shown in phantom in FIG. 7) are used to connect the bottom signal layer 52 to the printed circuit board 46. An evenly-spaced array of solder bumps, e.g., a 6×6 array, may be formed on the bottom signal layer 52. Solder bumps 130 connect the input voltage electrode 122 to the input voltage terminal 20, solder bumps 132 connect intermediate voltage electrode 120 to intermediate terminal 22, and solder bumps 134 connect ground electrode 124 to the ground plane of the printed circuit board. In general, increasing the number of solder bumps lowers the impedance of the connection between the substrate and printed circuit board.

In another implementation, the integrated circuit chip 42″ may be mounted directly on a printed circuit board. As shown in FIGS. 8A-8G, the printed circuit board may have an input voltage electrode 90', a ground electrode 92', and an intermediate voltage electrode 94'. The electrodes on the printed circuit board may have different configurations, and the chip 42″ may have different numbers and configurations of solder balls to connect the drain and source pads on the chip to the input, ground and intermediate electrodes.

Referring to FIG. 9, the other integrated circuit components of the switching regulator 10, such as the feedback circuit 28 and the pulse modulator 18 from the controller assembly, can be fabricated on a second IC chip 140 (which can be a flip-chip or a wire bound chip) that is coupled to the printed circuit board 46 separately from the first IC chip 42. Alternatively, as shown in FIG. 10, both the switching circuit IC chip 42 and the second IC chip 140 could be electrically coupled to the printed circuit board 46 by the same substrate 44'. Of course, this will require a different layout of the top and bottom signal layers of the substrate 44' in order to carry signals between the first and second chips 42, 140. As previously noted, the first IC chip 42 can include circuitry that interprets commands generated by the controller assembly, and circuitry that provides feedback to the controller assembly.

The elements of the output filter 26, such as the inductor 3, the filter capacitor 36, and the input capacitor 38 may be mounted at least partly on the substrate 44 (as shown in phantom in FIG. 2). For example, one terminal of the inductor 34 may be connected directly to the intermediate voltage electrode 94. The other terminal of the inductor 34 may be connected to another electrode on the substrate (which would be coupled to the printed circuit board through a via and the bottom signal layer) or directly to the printed circuit board. If the inductor is mounted on the substrate, the filter capacitor 36 may either be mounted on the substrate (as illustrated in FIG. 2) or connected directly to the printed circuit board. Alternately, all the elements of the output filter 26, including the inductor 34 and the capacitor 36, may be mounted directly on the printed circuit board 46 (as illustrated in FIG. 9). If the switching circuit 16 includes a rectifier instead of a second transistor, the rectifier can be connected to the printed circuit board 46 or to the substrate 44 separately from the first chip 42.

The input capacitor 38 connects the input terminal 22 to ground to compensate for stray inductance on the ground and power supply lines. Placing the input capacitor 38 close to the switching regulator keeps the inductance and resistance low. Preferably, the input capacitor 38 is mounted on the substrate (as illustrated in phantom FIG. 2), although it can be connected directly to the printed circuit board (as illustrated in FIG. 9).

Numerous modifications to the configuration of the flip-chip design will occur to those of ordinary skill in the art. The intermediate voltage electrode plane 120 need not be a figure-eight shape, and the input and ground electrode planes 122 and 124 need not be rectangular, so long as the vias connect the appropriate portions of the top and bottom signal layers. The solder balls 58 can be larger or smaller than the solder bumps 56, and neither need be disposed in a regular array. The pads can be shapes other than rectangular or octagonal. Other configurations are possible for the distributed array of transistors, and other patterns are possible for the contact pads.

The invention is not limited to the embodiment depicted and described. Rather, the scope of the invention is defined by the appended claims.

What is claimed is:

1. An integrated circuit structure comprising:
    a substrate having a first plurality of doped regions and a second plurality of doped regions, the first plurality of doped regions and the second plurality of doped regions being arranged in an alternating pattern; and
    a gate region on the substrate separating the first plurality of doped regions and the second plurality of doped regions.

2. The integrated circuit structure of claim 1, wherein the first plurality of doped regions and the second plurality of doped regions are arranged in a rectangular array.

3. The integrated circuit structure of claim 1, wherein the gate region is a unitary gate structure separating adjacent doped regions of the first plurality of doped regions and the second plurality of doped regions.

4. The integrated circuit structure of claim 1, wherein the first plurality of doped regions and the second plurality of doped regions are substantially rectangular, and the gate region forms a rectangular grid separating the first plurality of doped regions and the second plurality of doped regions.

5. The integrated circuit structure of claim 1, wherein the first plurality of doped regions are source regions of a distributed transistor array and the second plurality of doped regions are drain regions of the distributed transistor array.

6. The integrated circuit structure of claim 5, wherein the distributed transistor array operates as a switch in a switching regulator circuit.

7. The integrated circuit structure of claim 5, wherein the distributed transistor array is a PMOS transistor.

8. The integrated circuit structure of claim 5, wherein the distributed transistor array is an NMOS transistor.

9. A voltage regulator having an input terminal and an output terminal, comprising:
    a printed circuit board;
    a first flip-chip type integrated circuit chip mounted on the printed circuit board, the first integrated circuit chip including a first power switch fabricated therein to alternately couple and decouple the input terminal to the output terminal, wherein the power switch includes
    a chip substrate having a first plurality of doped regions and a second plurality of doped regions, the first plurality of doped regions and the second plurality of doped regions being arranged in an alternating pattern, the first plurality of doped regions coupled to the input terminal, the second plurality of doped regions coupled to the output terminal, and
    a gate region on the chip substrate separating the first plurality of doped regions and the second plurality of doped regions;
    a filter disposed to provide a substantially DC voltage at the output terminal; and
    a control circuit connected to the gate region to control the power switch to maintain the DC voltage substantially constant.

10. The voltage regulator of claim 9, wherein the first plurality of doped regions and the second plurality of doped regions are arranged in a rectangular array.

11. The voltage regulator of claim 9, wherein the gate region is a unitary gate structure separating adjacent doped regions of the first plurality of doped regions and the second plurality of doped regions.

12. The voltage regulator of claim 9, wherein the first plurality of doped regions and the second plurality of doped regions are substantially rectangular, and the gate region forms a rectangular grid separating the first plurality of doped regions and the second plurality of doped regions.

13. The voltage regulator of claim 9, wherein the first plurality of doped regions are source regions of a distributed transistor array and the second plurality of doped regions are drain regions of the distributed transistor array.

14. The voltage regulator of claim 13, wherein the distributed transistor array is a PMOS transistor.

15. The voltage regulator of claim 13, wherein the distributed transistor array is an NMOS transistor.

16. The voltage regulator of claim 9, wherein the first power switch and filter form a buck-converter topology.

17. The voltage regulator of claim 9, wherein the first power switch intermittently couples an intermediate terminal to the input terminal.

18. The voltage regulator of claim 17, wherein the first flip-chip type integrated circuit chip has a second power switch fabricated therein to alternately couple and decouple the intermediate terminal to ground.

19. The voltage regulator of claim 18, wherein the filter is electrically coupled between the output terminal and the intermediate terminal.

20. The voltage regulator of claim 18, wherein the first power switch includes a distributed array of PMOS transistors and the second power switch includes a distributed array of NMOS transistors.

21. The voltage regulator of claim 17, further comprising a rectifier connecting the intermediate terminal to ground.

22. An integrated circuit chip with a power switch for a voltage regulator fabricated thereon, comprising:
    a substrate having a first plurality of doped regions and a second plurality of doped regions, the first plurality of doped regions and the second plurality of doped regions being arranged in a first alternating pattern;
    a gate region on the substrate separating the first plurality of doped regions and the second plurality of doped regions; and
    an array of metalized pads fabricated on a surface of the substrate, the array including a first plurality of pads and a second plurality of pads, the first and second pluralities of pads being arranged in a second alternating pattern;
    wherein the first plurality of pads are electrically connected to the first plurality of doped regions and the second plurality of pads are electrically connected to the second plurality of doped regions, and wherein the first plurality of pads are connected to a first terminal of the voltage regulator and the second plurality of pads are connected to a second terminal in the voltage regulator.

23. The chip of claim 22, wherein the first alternating pattern is a rectangular array.

24. The chip of claim 22, wherein the gate region is a unitary gate structure separating adjacent doped regions of the first plurality of doped regions and the second plurality of doped regions.

25. The chip of claim 22, wherein the first plurality of doped regions and the second plurality of doped regions are substantially rectangular, and the gate region forms a rectangular grid separating the first plurality of doped regions and the second plurality of doped regions.

26. The chip of claim 22, wherein the first plurality of doped regions are source regions of a distributed transistor array and the second plurality of doped regions are drain regions of the distributed transistor array.

27. The chip of claim 26, wherein the distributed transistor array operates as a switch in a switching regulator circuit.

28. The chip of claim 22, wherein the second alternating pattern is a first set of alternating stripes.

29. The chip of claim 22, wherein the second alternating pattern is a checkerboard pattern.

30. The chip of claim 22, wherein the first and second pluralities of doped regions are p+ regions formed in an n-type well or substrate.

31. The chip of claim 30, wherein the first terminal is an input terminal and the second terminal is an intermediate terminal.

32. The chip of claim 22, wherein the first and second pluralities of doped regions are n+ regions formed in a p-type well or substrate.

33. The chip of claim 32, wherein the first terminal is a ground terminal and the second terminal is an intermediate terminal.

* * * * *

(12) EX PARTE REEXAMINATION CERTIFICATE (7960th)
United States Patent
Burstein et al.

(10) Number: US 6,462,522 C1
(45) Certificate Issued: Jan. 4, 2011

(54) TRANSISTOR PATTERN FOR VOLTAGE REGULATOR

(75) Inventors: Andrew J. Burstein, Mountain View, CA (US); Charles Nickel, San Jose, CA (US)

(73) Assignee: Volterra Semiconductor Corporation, Fremont, CA (US)

Reexamination Request:
No. 90/009,437, Apr. 30, 2009

Reexamination Certificate for:
Patent No.: 6,462,522
Issued: Oct. 8, 2002
Appl. No.: 09/892,233
Filed: Jun. 26, 2001

Related U.S. Application Data

(63) Continuation of application No. 09/498,297, filed on Feb. 4, 2000, now Pat. No. 6,278,264.

(51) Int. Cl.
*G05F 1/40* (2006.01)
*H01L 23/053* (2006.01)

(52) U.S. Cl. .................................. 323/282; 257/700
(58) Field of Classification Search .................. None
See application file for complete search history.

(56) References Cited

U.S. PATENT DOCUMENTS

| | | |
|---|---|---|
| 3,303,393 A | 2/1967 | Hymes et al. |
| 3,388,301 A | 6/1968 | James |
| 3,429,040 A | 2/1969 | Miller |
| 3,689,991 A | 9/1972 | Aird |
| 3,739,236 A | 6/1973 | Loro |
| 3,871,014 A | 3/1975 | King et al. |
| 3,922,712 A | 11/1975 | Stryker |
| 4,000,842 A | 1/1977 | Burns |
| 4,074,342 A | 2/1978 | Honn et al. |
| 4,095,165 A | 6/1978 | Boros |
| 4,109,194 A | 8/1978 | Miller |
| 4,188,438 A | 2/1980 | Burns |
| 4,190,855 A | 2/1980 | Inoue |
| 4,233,558 A | 11/1980 | Gaertner |
| 4,255,672 A | 3/1981 | Ohno et al. |
| 4,292,581 A | 9/1981 | Tan |
| 4,309,650 A | 1/1982 | Boros et al. |
| 4,315,316 A | 2/1982 | Boros et al. |
| 4,353,114 A | 10/1982 | Saleh |
| 4,356,542 A | 10/1982 | Bruckner et al. |
| 4,357,572 A | 11/1982 | Andersen et al. |
| 4,520,298 A | 5/1985 | Abbondanti |

(Continued)

FOREIGN PATENT DOCUMENTS

| | | |
|---|---|---|
| EP | 0 357 064 | 3/1993 |
| EP | 547916 | 6/1993 |
| JP | 53-39068 | 4/1978 |
| JP | 57210638 A | 12/1982 |
| JP | 60250639 A | 12/1985 |
| JP | 611-42750 A | 6/1986 |
| JP | 6114538 A | 7/1986 |
| WO | WO85/04518 | 10/1985 |
| WO | WO95/31033 | 11/1995 |
| WO | WO99/31790 | 6/1999 |
| WO | WO01/57608 | 8/2001 |

OTHER PUBLICATIONS

Stratakos et al., "A Low Voltage CMOS DC–DC Converter for a Portable Battery–Operated System" 1994, pp. 619–626.*

(Continued)

*Primary Examiner*—Tuan H Nguyen

(57) ABSTRACT

A voltage regulator with an input terminal and an output terminal has a printed circuit board, a substrate mounted on the printed circuit board, and a first flip-chip type integrated circuit chip mounted on the substrate. The first integrated circuit chip includes a first power switch fabricated therein to alternately couple and decouple the input terminal to the output terminal. A filter is disposed to provide a substantially DC voltage at the output terminal, and a control circuit controls the power switch to maintain the DC voltage substantially constant.

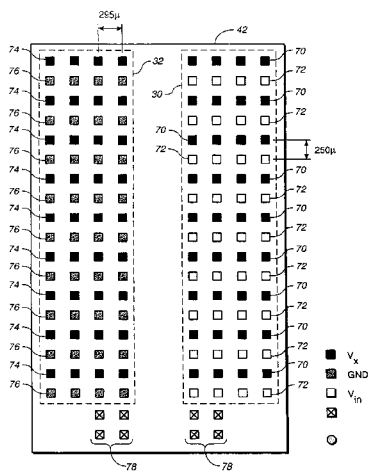

U.S. PATENT DOCUMENTS

| | | |
|---|---|---|
| 4,521,725 A | 6/1985 | Phaneuf |
| 4,545,610 A | 10/1985 | Lakritz et al. |
| 4,580,089 A | 4/1986 | Grunsch et al. |
| 4,612,617 A | 9/1986 | Laplace, Jr. et al. |
| 4,630,187 A | 12/1986 | Henze |
| 4,636,825 A | 1/1987 | Baynes |
| 4,695,865 A | 9/1987 | Wagenaar |
| 4,725,747 A | 2/1988 | Stein et al. |
| 4,725,940 A | 2/1988 | Henze |
| 4,761,725 A | 8/1988 | Henze |
| 4,805,079 A | 2/1989 | Van Buul |
| 4,811,082 A | 3/1989 | Jacobs et al. |
| 4,821,084 A | 4/1989 | Kinugasa et al. |
| 4,825,284 A | 4/1989 | Soga et al. |
| 4,833,513 A | 5/1989 | Sasaki |
| 4,843,188 A | 6/1989 | Patterson et al. |
| 4,855,888 A | 8/1989 | Henze et al. |
| 4,890,142 A | 12/1989 | Tonnel et al. |
| 4,918,026 A | 4/1990 | Kosiak et al. |
| 4,926,241 A | 5/1990 | Carey |
| 4,929,884 A | 5/1990 | Bird et al. |
| 4,937,075 A | 6/1990 | Hollingsworth et al. |
| 4,947,101 A | 8/1990 | McVey |
| 4,948,645 A | 8/1990 | Holzinger et al. |
| 4,948,754 A | 8/1990 | Kondo et al. |
| 4,949,139 A | 8/1990 | Korsh et al. |
| 4,970,575 A | 11/1990 | Soga et al. |
| 5,003,244 A | 3/1991 | Davis, Jr. |
| 5,029,282 A | 7/1991 | Ito |
| 5,039,628 A | 8/1991 | Carey |
| 5,046,657 A | 9/1991 | Iyer et al. |
| 5,047,358 A | 9/1991 | Kosiak et al. |
| 5,111,278 A | 5/1992 | Eichelberger |
| 5,146,300 A | 9/1992 | Hamamoto et al. |
| 5,220,200 A | 6/1993 | Blanton |
| 5,239,196 A | 8/1993 | Ikeda et al. |
| 5,261,593 A | 11/1993 | Casson et al. |
| 5,268,871 A | 12/1993 | Dhong et al. |
| 5,272,614 A | 12/1993 | Brunk et al. |
| 5,283,452 A | 2/1994 | Shih et al. |
| 5,296,738 A | 3/1994 | Freyman et al. |
| 5,299,091 A | 3/1994 | Hoshi et al. |
| 5,305,192 A | 4/1994 | Bonte et al. |
| 5,309,324 A | 5/1994 | Herandez et al. |
| 5,352,942 A | 10/1994 | Tanaka et al. |
| 5,391,904 A | 2/1995 | Asami et al. |
| 5,399,898 A | 3/1995 | Rostoker |
| 5,410,467 A | 4/1995 | Smith et al. |
| 5,412,239 A | 5/1995 | Williams |
| 5,422,562 A | 6/1995 | Mammano et al. |
| 5,438,499 A | 8/1995 | Bonte et al. |
| 5,439,162 A | 8/1995 | George et al. |
| 5,453,953 A | 9/1995 | Dhong et al. |
| 5,457,878 A | 10/1995 | Rostoker et al. |
| 5,468,681 A | 11/1995 | Pasch |
| 5,468,984 A | 11/1995 | Efland et al. |
| 5,475,296 A | 12/1995 | Vinsant et al. |
| 5,479,089 A | 12/1995 | Lee |
| 5,481,178 A | 1/1996 | Wilcox et al. |
| 5,503,286 A | 4/1996 | Nye, III et al. |
| 5,514,947 A | 5/1996 | Berg |
| 5,521,426 A | 5/1996 | Russell |
| 5,528,480 A | 6/1996 | Kikinis et al. |
| 5,546,297 A | 8/1996 | Duley |
| 5,547,740 A | 8/1996 | Higdon et al. |
| 5,552,694 A | 9/1996 | Appeltans |
| 5,564,617 A | 10/1996 | Degani et al. |
| 5,578,916 A | 11/1996 | Muterspaugh |
| 5,594,631 A | 1/1997 | Katoozi et al. |
| 5,600,257 A | 2/1997 | Leas et al. |
| 5,610,452 A | 3/1997 | Shimer et al. |
| 5,610,503 A | 3/1997 | Fogg et al. |
| 5,612,553 A | 3/1997 | Arakawa |
| 5,614,762 A | 3/1997 | Kanamori et al. |
| 5,615,477 A | 4/1997 | Sweitzer |
| 5,646,513 A | 7/1997 | Riggio, Jr. |
| 5,659,950 A | 8/1997 | Adams et al. |
| 5,665,991 A | 9/1997 | Efland et al. |
| 5,671,121 A | 9/1997 | McMahon |
| 5,672,894 A | 9/1997 | Maeda et al. |
| 5,675,240 A | 10/1997 | Fujisawa et al. |
| 5,677,618 A | 10/1997 | Fiez et al. |
| 5,677,619 A | 10/1997 | Doluca |
| 5,684,305 A | 11/1997 | Pearce |
| 5,684,328 A | 11/1997 | Jin et al. |
| 5,696,031 A | 12/1997 | Wark |
| 5,721,144 A | 2/1998 | Hsieh et al. |
| 5,723,974 A | 3/1998 | Gray |
| 5,731,223 A | 3/1998 | Padmannabhan |
| 5,744,843 A | 4/1998 | Efland et al. |
| 5,751,140 A | 5/1998 | Canter |
| 5,757,168 A | 5/1998 | DeVale |
| 5,767,010 A | 6/1998 | Mis et al. |
| 5,777,362 A | 7/1998 | Pearce |
| 5,777,383 A | 7/1998 | Stager et al. |
| 5,793,126 A | 8/1998 | Gray |
| 5,801,091 A | 9/1998 | Efland et al. |
| 5,814,844 A | 9/1998 | Nagata et al. |
| 5,818,090 A | 10/1998 | Kimura |
| 5,834,849 A | 11/1998 | Lane |
| 5,838,050 A | 11/1998 | Ker et al. |
| 5,847,951 A | 12/1998 | Brown et al. |
| 5,859,474 A | 1/1999 | Dordi |
| 5,903,058 A | 5/1999 | Akram |
| 5,914,873 A | 6/1999 | Blish, II |
| 5,945,730 A * | 8/1999 | Sicard et al. ............... 257/666 |
| 5,945,872 A | 8/1999 | Robertson et al. |
| 5,950,072 A | 9/1999 | Queyssac |
| 5,951,804 A | 9/1999 | Kweon et al. |
| 5,951,813 A | 9/1999 | Warren |
| 5,952,726 A | 9/1999 | Liang |
| 5,953,214 A | 9/1999 | Dranchak et al. |
| 5,959,442 A | 9/1999 | Hallberg et al. |
| 5,959,443 A | 9/1999 | Littlefield |
| 5,969,513 A | 10/1999 | Clark |
| 5,969,514 A | 10/1999 | Merrill |
| 6,020,613 A | 2/2000 | Udomoto et al. |
| 6,020,729 A * | 2/2000 | Stratakos et al. ............ 323/283 |
| 6,025,618 A | 2/2000 | Chen |
| 6,028,417 A | 2/2000 | Ang et al. |
| 6,031,361 A | 2/2000 | Burstein et al. |
| 6,037,636 A | 3/2000 | Crippen |
| 6,037,677 A | 3/2000 | Gottschall et al. |
| 6,041,013 A | 3/2000 | Kohno |
| 6,075,710 A | 6/2000 | Lau |
| 6,084,266 A | 7/2000 | Jan |
| 6,100,591 A | 8/2000 | Ishii |
| 6,100,676 A | 8/2000 | Burstein et al. |
| 6,117,797 A | 9/2000 | Hembree |
| 6,133,634 A | 10/2000 | Joshi |
| 6,150,724 A | 11/2000 | Wenzel et al. |
| 6,159,841 A | 12/2000 | Williams et al. |
| 6,160,441 A | 12/2000 | Stratakos et al. |
| 6,180,265 B1 | 1/2001 | Erickson |
| 6,184,555 B1 | 2/2001 | Tihanyi et al. |
| 6,198,261 B1 | 3/2001 | Schultz et al. |
| 6,225,795 B1 | 5/2001 | Stratakos et al. |
| 6,268,716 B1 | 7/2001 | Burstein et al. |
| 6,271,060 B1 | 8/2001 | Zandman et al. |
| 6,278,264 B1 | 8/2001 | Burstein et al. |
| 6,287,893 B1 | 9/2001 | Elenius et al. |

| | | |
|---|---|---|
| 6,331,455 B1 | 12/2001 | Rodov et al. |
| 6,400,126 B1 | 6/2002 | Zuniga et al. |
| 6,429,630 B2 | 8/2002 | Pohlman |
| 6,441,487 B2 | 8/2002 | Elenius et al. |
| 6,459,248 B2 | 10/2002 | Pohlman |
| 6,476,486 B1 | 11/2002 | Humphrey et al. |
| 6,477,079 B2 | 11/2002 | Kaneko et al. |
| 6,489,678 B1 | 12/2002 | Joshi |
| 6,492,738 B2 | 12/2002 | Akram et al. |
| 6,501,166 B2 | 12/2002 | Wood et al. |
| 6,507,175 B2 | 1/2003 | Susak et al. |
| 6,512,253 B2 | 1/2003 | Watanabe et al. |
| 6,525,516 B2 | 2/2003 | Schultz et al. |
| 6,559,684 B2 | 5/2003 | Goodfellow et al. |
| 6,563,294 B2 | 5/2003 | Duffy et al. |
| 6,570,406 B2 | 5/2003 | Tang et al. |
| 6,580,258 B2 | 6/2003 | Wilcox et al. |
| 6,621,312 B2 | 9/2003 | Tang et al. |
| 6,642,698 B2 | 11/2003 | Pohlman |
| 6,661,212 B2 | 12/2003 | Ostrom |
| 6,670,795 B2 | 12/2003 | Pohlman et al. |
| 6,670,858 B2 | 12/2003 | Tang |
| 6,674,320 B2 | 1/2004 | Duffy et al. |
| 6,693,361 B1 | 2/2004 | Siniaguine et al. |
| 6,700,209 B1 | 3/2004 | Raiser et al. |
| 6,703,814 B2 | 3/2004 | Pohlman et al. |
| 6,710,605 B2 | 3/2004 | Tang et al. |
| 6,713,823 B1 | 3/2004 | Nickel |
| 6,794,900 B2 | 9/2004 | Tang et al. |
| 6,821,813 B2 | 11/2004 | Su |
| 6,847,197 B2 | 1/2005 | Susak et al. |
| 6,857,081 B2 | 2/2005 | Pohlman |
| 6,937,685 B2 | 8/2005 | Tang |
| 6,965,502 B2 | 11/2005 | Duffy et al. |
| 6,984,792 B2 | 1/2006 | Brofman et al. |
| 6,992,384 B2 | 1/2006 | Joshi |
| 7,002,249 B2 | 2/2006 | Duffy et al. |
| 7,007,176 B2 | 2/2006 | Goodfellow et al. |
| 7,023,672 B2 | 4/2006 | Goodfellow et al. |
| 7,262,583 B2 | 8/2007 | Pohlman et al. |
| 7,301,235 B2 | 11/2007 | Schaffer et al. |
| 7,366,270 B2 | 4/2008 | Tang et al. |
| 7,391,192 B2 | 6/2008 | Ostrom et al. |
| 2001/0015497 A1 | 8/2001 | Zhao et al. |
| 2001/0038277 A1 | 11/2001 | Burstein et al. |
| 2002/0017697 A1 | 2/2002 | Kitamura et al. |
| 2004/0130303 A1 | 7/2004 | Pohlman et al. |
| 2008/0185736 A1 | 8/2008 | Lin |
| 2008/0187037 A1 | 8/2008 | Bulzacchelli et al. |
| 2008/0197172 A1 | 8/2008 | Reiber |

OTHER PUBLICATIONS

1996 International Symposium on Microelectronics, Oct. 8–10, 1996, Minneapolis Convention Center, Minneapolis, Minnesota, published in cooperation with SPIE—the International Society for Optical Engineering, Mis, J.D., et al., "Flip Chip Production Experience: Some Design, Process, Reliability, and Cost Considerations" vol. 2920, ISBN [0–930815–48–3], 1996, pp. 291–295 (7 pages).

Advanced Micro Devices, The AMD Fine–Pitch Ball Grid Array (FBGA) for Flash Memory and Chip–Scale Packaging for AMD Flash Memory Products, Sep. 3, 1998, 3 pages and Sep. 28, 1998, 7 pages.

Bae, Seung–Jun et al., "A 2–Gb/s CMOS Interating Two–Tap DFE Receiver for Four–Drop Single–Ended Signaling", IEEE Transactions on Circuits and Systems–I: Regular Papers, vol. 56, No. 8, Aug. 2009, pp. 1645 and 1647 (2 pages).

Baggerman, Antal F., et al., "Low–Cost Flip–Chip on Board", IEEE Transactions on Components, Packaging, and Manufacturing Technology—Part B., vol. 19, No. 4, Nov. 1996, 11 pages.

Baker, R. Jacob, CMOS Mixed–Signal Circuit Design, vol. II of CMOS: Circuit Design, Layout, and Simulation, Chapter 32 Noise–Shaping Data Converters, 2002, pp. 155; 263 (4 pages).

Bobrow, Leonard S., "Fundamentals of Electrical Engineering", Department of Electrical and Computer Engineering, University of Massachusetts, Amherst, Oxford University Press, pp. 894; 895 (4 pages).

Borivoje, Nikolic, EE290C—Spring 2004, Advanced Topics in Circuit Design, High–Speed Electrical Interfaces, Lecture 16, Components Decision Feedback Equalizers, Lecture 16, Mar. 11, 2004, pp. 1–19 (19 pages).

Brooks, Richard, et al., ICEMM Proceedings 1993, "Direct Chip Attach—A Viable Chip Mounting Alternative", pp. 595–598, 4 pages.

Cherry Semiconductor Datasheet, CS3341/51—CS386/387, "Alternator Voltage Regulator Darlington Driver", 7 pages, 1999, Cherry Semiconductor Corporation, downloaded from Internet @ www.datasheetcatalog.com on Jul. 2010.

Chip Assembly Technologies, obtained from Internet: http://www.wtec.org/loyola/ep/c4s8.htm, published Feb. 1995, 5 pages.

"Chip on board Definition from PC Magazine Encyclopedia" obtained from the Internet at http://www.pcmag.com/encyclopedia_term/0,2542,t=chip+on+board&i=39643,00., Mar. 29, 2010; copyright © 1996–2010, 2010 Ziff Davis Publishing Holdings Inc. (3 pages).

Chip on board (COB) C–MAC Micro Technology, 2010, http://www.cmac.com/products–and–applications/COB.php, (1 page).

Cho, Thomas B., et al., "A 10–bit, 20–MS/s, 35–m W Pipeline A/D Converter1", Department of Electrical Engineering and Computer Sciences, University of California, Berkeley, 1994, pp. 129–144 (16 pages).

Cho, et al., "Design Consideration for High–Speed Low–Power, Low–Voltage CMOS Analog–to–Digital Converters", Department of Electrical Engineering and Computer Sciences, University of California at Berkeley; Digest of Technical papers, Advanced Analog Integrated Circuit Symposium, 1994, pp. 149–171 (23 pages).

Clough, Sherry L., Thesis "Flip Chip Attachment Methods: A Methodology for Evaluating the Effect of Supplier Process Variation and Supplier Relationships on Product Reliability", B.S.E. Industrial and Operations Engineering, University of Michigan, submitted to the Sloan School of Management and the Dept. of Materials Science Engineering on May 8, 1998, 110 pages.

Corbin, J. S., "Finite Element Analysis for Solder Ball Connect (SBC) Structural Design Optimization", IBM J. Res. Develop, vol. 37, No. 5, Sep. 1993, pp. 585–596 (12 pages).

DeHaven, Keith, et al., "Controlled Collapse Chip Connection (C4)—An Enabling Technology", IEEE, 1994, pp. 1–6 (6 pages).

Takashi, Yasuo, et al., "Microjoining Process in Electronic Packaging and Its Numerical Analysis", Trans. JWRI, vol. 30, No. 1 (2001), pp. 1–11 (11 pages).

Davis, Paul C., et al., "Design of an Integrated Circuit for the T1C Low–Power Line Repeater", IEEE Journal of Solid–State Circuits, vol. SC–14, No. 1, Feb. 1979, pp. 109–120 (12 pages).

Doyle. Rory., et al., "Glob–Top Reliability Characterization: Evaluation and Analysis Method", IEEE Transactions on Components, Packaging, and Manufacturing Technology—Part A, vol. 21, No. 2, Jun. 1998, (pp. 292–300), 9 pages.

Electronicsweekly.com, Lord Corporation Announces Advancements in flip chip underfill technology, Thursday, Aug. 30, 2007, obtained from Internet: electronicsweekly.com, Jul. 22, 2010 (1 page).

Electronic Design—for Engineers and Engineering Managers—WorldWide, cover feature, Goodenough, Frank, "High–Output Switcher IC Converts 5V to Less than 3V", Jun. 24, 1996, pp. 55–60.

"Electronic Packaging", Wikipedia, the free encyclopedia, http://en.wikipedia.org/wiki/Electronic_packaging, last modified Apr. 22, 2010 (4 pages).

EE (Electronic Enginnering) Times—25th Anniversary. Electronics on the Threshold of the New Millennium, Issue 978, The Inudstry Newspaper for Engineers and Technical Management, Oct. 30, 1997 (538 pages).

Emulation Technology, Inc., Chip–On–Board/Chip–On–Flex/Bare Die Assemblies, obtained from internet http://www.emulation.com/catalog/die/attach.cfm, 2010 (1 page).

Emami–Neyestanak, Azita "Design of CMOS Receivers for Parallel Optical Interconnects", A Dissertation Submitted to the Department of Electrical Engineering and the Committe on Graduate Studies of Standord University in Partial Fulfillment of the Requirements for the Degree of Doctor of Philosophy, Aug. 2004, pp. 13–14 (3 pages).

Gilleo, Ken, "Direct Chip Interconnect Using Polymer Bonding", IEEE Transactions on Components, Hybrids, and Manufacturing Technology, vol. 13, No. 1, Mar. 1990, pp. 229–234 (6 pages).

Gray, Paul, Reading Materials for EE290Y, No. 334, University of California, Berkeley, CA, Spring 1995, Boser, "The Design of Sigma–Delta Modulation Analog–to–Digital Converters", pp. 215–224 (14 pages).

Gray, Paul R., EECS290Y, Spring 1995, Analog–Digital Interfaces in VLSI Technology, University of California, College of Engineering. Dept. of Electrical Engineering and Computer Sciences, 1995, 19 pages.

Greathouse, Steve., "Chip Size Solutions: A Comparison", Intel Corporation, Chandler, AZ, SMI (Surface Mount International—Advanced Electronics Manufacturing Technologies), Proceedings of The Technical Program, San Jose, CA Aug. 29–31, 1995, pp. 36–42 (8 pages).

Gregorian, Roubik, et al., "Analog MOS Integrated Circuits for Signal Processing", A Wiley–Interscience Publication, John Wiley & Sons, Inc., ISBN 0–47–09797–7, 1986, pp. 31–32 (4 pages).

Greig, William. J., "Integrated Circuit Packaging, Assembly and Interconnections", Library of Congress Control No. 2006927423, ISBN 0–387–28153–3, Copyright Springer Science+Business Media LLC 2007 (3 pages).

Garrou, Philip E., et al., "Multichip Module Technology Handbook", McGraw–Hill, ISBN 0–07–022894–9, 1998 (12 pages).

Ginsberg, Gerald L., et al., "Multichip Modules and Related Technologies", ISBN 0–07–023552–X, 1994, 297 pages.

08–CV–5129–JCS, Exhibit 18, to the Reply Expert Report of Philip Garrou, Ph.D. on the Issues of Invalidity of U.S. Patent Nos. 6,278,264 and 6,462,522, Glossary of terms used in electronics, obtained from Internet, http://www.ami.ac.uk/courses/topics/0100_gls/glossary/glossc.htm, 2010, 6 pages.

Goodman, Thomas W., et al., TechSearch International, Inc., Technology Licensing and Consulting FCIP and Expanding Markets for Flip Chip, Jul. 1997, 271 pages.

Henkel Electronics Assembly Solutions, http://www.henkel-na.com/us/content_data/121959_LT5012_PCB_BroInside_final.pdf, retrieved from Internet Jun. 9, 2010 (39 pages).

Hu, Timothy Hak–Ting "A Parallel Architecture for High–Data–Rate Digital Receivers in Scaled CMOS Technology", Electronics Research Laboratory, College of Engineer, University of California, Berkeley, Memorandum No. UCB/ERL M93/62, Jul. 26, 1993, pp. 1, 48, and 54 (4 pages).

Hnatek, Eugene R., Integrated Circuit Quality and Reliability, second edition, revised and expanded, Marcel Dekker, 1995, p. 303, 8 pages.

Hnatek, Eugene R., Integrated Circuit Quality and Reliability, second edition, revised and expanded, Marcel Dekker, 1995, Ch. 2, pp. 84–85, 9 pages.

Infineon, Product Data Sheet, TDA7210V, Revision 1.1, Jun. 18, 2010, obtained from Internet, http://www.infineon.com/dgdl/TDA721V_DS_Preliminary_V0.9.pdf?folderId=db3a3043191a246301192dd3ee2c2ae4&filedId=db3a3043271faefd012776007d8015f4.

Inose, Hiroshi, et al., "A Unity Bit Coding Method by Negative Feedback", in Oversampling Delta–Sigma Data Converters, Theory, Design, and Simulation, edited by James C. Candy, et al., The Institute of Electrical and Electronics Engineers, Inc., IEEE Press, ISBN 0–87942–285–8, IEEE Order No. PC0274–1, 1992, pp. 115–126 (14 pages).

Intel Packaging Databook, Jan. 1998, 30 pages.

IPC Association Connecting Electronics Industries, IPC–SM–784, Guidelines for Chip–on–Board Technology Implementation, ANSI/IPC–SM–784, Nov. 1990, 53 pages.

IEEE Standard Dictionary of Electrical and Electronics Terms, ANSI/IEEE Std. 100–1988 Fourth Edition, 1988, published by the Institute of Electrical and Electronics Engineers, Inc., p. 855 sampled data through saturated (4 pages).

Kenny, John G., et al., "Multi–level Decision Feedback Equalization for Saturation Recording", IEEE Transactions on Magnetics, vol. 29, No. 3, Jul. 1993, pp. 2160–2171, 12 pages.

Koc, Ut–Va "Adaptive Electronic Dispersion Compensator for Chromatic and Polarization–Mode Dispersions in Optical Communication Systems", EURASIP Journal on Applied Signal Processing, vol. 2005: No. 10, Received Apr. 1, 2004; Revised Nov. 30, 2004, pp. 1584–1588 (3 pages).

Gray, Paul, R. "Analog MOS Integrated Circuits, II", Koch, et al. "A 12–bit Sigma–Delta Analog–to–Digital Converter with a 15–MHz Clock Rate", Analog MOS Integrated Circuits, II, IEEE J. Solid–State Circuits, ISBN 0–87942–246–7.

Ker, M., et al., "Area–Efficient Layout Design for CMOS Output Transistors", IEEE Transactions on Electron Devices, vol. 44, No. 4, Apr. 1997, pp. 635–645 (11 pages).

Kolding, T. E., "Test Structure For Universal Estimation of MOSFET Substrate Effects at Gigahertz Frequencies", IEEE ICMTS, Monterey, California, USA, Mar. 2000, pp. 106–111 (6 pages).

Krishna, Kannan, et al., "A Multigigabit Backplane Transceiver Core in 0.13–µm CMOS With a Power–Efficient Equalization Architecture", IEEE Journal of Solid–State Circuits, vol. 40, No. 12, Dec. 2005, pp. 2658; 2660 (2 pages).

Kraynak, Paul, "Wafer–Chip Assembly for Large–Scale Integration", IEEE Transactions on Electron Devices, vol. ED–15, No. 9, Sep. 1968, pp. 660–663, (4 pages).

Lau, John H., et al., "Chip Scale Package (CSP) Design, Materials, Processes, Reliability, and Applications", McGraw–Hill, ISBN 0–07–038304–9, Chapter 1, "Solder–Bumped Flip Chip and Wire–Bonding Chip on CSP Substrate", 4 pages, Copyright 1999.

Lee, Edward, et al., Digital Communication, An Overview of Basic PAM Techniques, Kluwer Academic Publishers, ISBN 0–89838–274–2, 1988, Sec. 6.1, pp. 151–153 (6 pages).

Leibowitz, B. S., et al., "Characterization of Random Decision Errors in Clocked Comparators", IEEE 2008 Custom Integrated Circuits Conference (CICC), 978–1–4244–2018–6, 2008, pp. 691–694 (4 pages).

Lin, Xiaofeng, et al., "A CMOS Analog Continuous–Time FIR Filter for 1Gbps Cable Equalizer", Department of Electrical Engineering, University of Texas at Dallas, Circuits and Systems, 2003, ISCAS '03, Proceedings of the 2003 International Symposium, (4 pages).

Loeffier, Mario, "Polymer–Core Solder Balls: An Alterantive to Solid Solder Balls?", CircuiTree, Tapco Circuit Supply, obtained from Internet, http://www.circuitree.com/Articles/Feature_Article/4d93912c4d26b010VgnVCM100000f932a8c0, Jul. 26, 2010, 4 pages.

Lu, Jicun, et al., "The International Journal of Microcircuits and Electronic Packaging—Detecting Underfill Delamination and Cracks in Flip Chip on Board Assemblies Using Infrared Microscope", vol. 21, No. 3, Third Quarter 1998 (ISSN 1063–1674), pp. 231–236, 11 pages.

Matthews, Thomas W., et al., "A Simulation Method for Accurately Determining DC and Dynamic Offsets in Comparators", 2005 IEEE International Midwest Symposium on Circuits and Systems, 2005 (4 pages).

McLenaghan, J. A., "Impact of Advanced Surface Mount Packages of SMT Manufacturing Process", Universal Instruments Corporation, Binghamton, NY, Surface Mount Technology Association Conference, 1996, pp. 501–507 (7 pages).

McLenaghan, J. A., "Integration of Flip Chip Assembly With Surface Mount Technology", Universal Instruments Corporation, Binghamton, NY, Surface Mount Technology Association Conference, 1996, pp. 303–309 (7 pages).

Motorola—TMOS Power MOSFET Transistor Device Data, Q2/96 DL135, Rev. 6, 1996 (1,184 pages).

μBGATM Design Process, Products MBGA—Design Process, downloaded from Internet, http://www.tessers.com/technology/p–design.htm, Aug. 28, 1998, 12 pages.

McGovern, Lawrence P., et al., "Initial Development Work on a High Throughput Low Cost Flip Chip on Board Assembly Process", in Processings 1997 International Symposium on Microelectronics, Oct. 14–16, 1997, SPIE vol. 3235, pp. 285–289, (8 pages).

Messner, George, et al. "Thin Film Multichip Modules", ISBN 0–930815–33–5, 1992, (12 pages).

Merriam Webster's Collegiate Dictionary—Tenth Edition, copyright 1994, ISBN 0–87779–708–0 (unindexed—ISBN 0–87779–709–9 (indexed), p. 984 , refuse—register (4 pages).

Modern Dictionary of Electronics Sixth Edition, Revised and Updated, Graf, Rudolf F., 1997, ISBN 0–7506–9870–5, pp. 121: building–out–circuit to bunch strandling and 548: lateral loss to layer–winding, 5 pages.

Motorola, Inc. Datasheet MCCF33095, MC33095 , Advance Information, Integral Alternator Regulator, 1996, downloaded from Internet at www.datasheetcatalog.com on Jul. 2010, 14 pages.

Mukherjee, Satyen, et al., "LDMOS and LIGT's In CMOS Technology for Power Integrated Circuits", 778–IEDM 87, 1987, 33.6, pp. 778–781 (4 pages).

McGraw–Hill Electronics Dictionary of Scientific and Technical Terms, Fifth Edition, Sybil B. Parker, 1994, p. 1229—measure through mechanical draft; p. 1748—salvage vessel through sampling spark chamber;—valley through vanadinite (6 pages).

Modern Dictionary of Electronics, Sixth Edition, Rudolf F. Graf, (Revised and Updated) (1997), pp. 183—compact cassette—compatibility; p. 879—sabin through sample–and–hold amplifier (5 pages).

Newaskar, Puneet P., et al., "A/D Precision Requirements for An Ultra–Wideband Radio Receiver", Microsystems Technology Laboratory, IEEE Xplore, downloaded on Jun. 9, 2010, pp. 270–275 (6 pages).

Nishimura, Ken A., "Optimum Partitioning of Analog and Digital Circuitry in Mixed–Signal Circuits for Signal Processing", Electronics Research Laboratory, College of Engineering, University of California, Berkeley, Memorandum No. UCB/ERL M93/67, Jul. 26, 1993, pp. 1, 6–8 (4 pages).

Nakano, Fumio, et al., "Proceedings of the 1987 International Symposium on Microelectronics", Sep. 28–30, 1987, Resin–Insertion Effect on Thermal Cycle Resistivity of Flip–Chip Mounted LSI Devices, pp. 536–541, Sep. 28–30, 1987 (7 pages).

National Semicoductor, LM2650, Synchronous Step–Down DC/DC Converter, 1996, 12 pages.

National Semiconductor, Press Release, "National Semiconductor Announces Industry's First 3 Amp Monolithic Synchronous Battery Switcher With Greater than 96% Efficiency" obtained from Internet, http://www.national.com/news/1996/9609/lm2650.html, Jul. 30, 2009, 2 pages.

New Webster's Dictionary of the English Language, College Edition, 1975, p. 118– balderdash through ballerina; p. 1146—plumbism to pluriaxial; p. 1374—sentence to sept. (6 pages).

New Webster's Dictionary of the English Language, College Edition, 1975, p. 1690—unionist through United Nations (4 pages).

O'Malley, Grace, et al., "The Importance of Material Selection for Flip Chip on Board Assemblies", IEEE Transactions on Components, Packaging, and Manufacturing Technology—Part B, vol. 17, No. 3, Aug. 1994, pp. 248–255 (8 pages).

Powell, D.O, et al., "Flip–Chip On FR–4 Integrated Circuit Packaging", 1993 Proceedings 43rd Electronic Components and Technology Conference, Jun. 1–4, in 1993, pp. 182–186 (6 pages).

Puttlitz, Karl J., et al. [editors], Area Array Interconnection Handbook, Kluwer Academic Publishers, ISBN 0–7923, 2001, 247 pages.

Razavi, Principles of Data Conversion System Design, IEEE Circuits and Systems, Sponsor, The Institute of Electrical and Electronics Engineers, Inc., New York, ISBN 0–7803–1093–4, IEEE Order N. PC4465, 1995, pp. 6–11; 176–197 (15 pages).

Razavi, Design of Analog CMOS Integrated Circuits, published by McGraw–Hill, ISBN 0–07–238032–2, 2001, p. 423 (3 pages).

Surface–mount technology—Wikipedia, the free encyclopedia, Surface–mount technology (9 pages), retrieved from Internet on Mar. 29, 2010, http://en.wikipedia.org/wiki/Surface–mount_technology.

Shi, Changchun, et al., "Floating–Point to Fixed–Point Conversion with Decision Errors Due to Quantization", Berkeley Wireless Research Center, Department of EECS, University of California, Berkeley, 2004, (4 pages).

Sewter, Jonathan, "Decision Feedback Equalizers and Their Application to Magnetic Storage Read Channels", ECE1352F Term Paper, 981514870, Nov. 15, 2002 (20 pages).

Shoval, Ayal, et al., "A 100 Mb/s BiCMOS Adaptive Pulse–Shaping Filter", IEEE Journal On Selected Areas in Communications, vol. 13, No. 9, Dec. 1995, pp. 1692 and 1699 (2 pages).

Shoval, D.A. Johns and W.M. Snelgrove, "Median–Based Offset Cancellation Circuit Technique", IEEE International Symposium on Circuits and Systems , San Diego, May 1992, pp. 2033–2036 (4 pages).

Shoval, Ayal, et al., "A CMOS Mixed–Signal 100Mbs Receive Architecture for Fast Ethernet", IEEE 1998 Custom Integrated Circuits Conference, (1998) pp. 12.1.1–12.1.4 (4 pages).

Somers, Steve, QSC—New Product Guide, AV Technology, DVI HDMI Signals Over Twisted–Pair Cable, Mar. 6, 2009 (3 pages), http://www.avtechnologyonline.com/article/27096.aspx.

Spineanu, Andreea, et al. "An Electromechanical Sigma–Delta Modulator For Acceleration Measuring Systems", 1997 IEEE International Symposium On Circuits and Systems, Jun. 9–12, 1997, pp. 2765–2768 (4 pages).

Sytsma, Steve., et al., "Die attach Processes for High Reliability Chip–On–Board (COB) Manufacturing", Pan Pacific Symposium Conference, Feb. 5, 2005, Surface Mount Technology Association (9 pages).

Sematech, Joint Industry Standard—Implementation of Flip Chip and Chip Scale Technology, J–STD–012, Jan. 1996, 13 pages.

Tummala, R. R., et al., [editors,] Microelectronics Packaging Handbook, 1989 by Van Nostrand Reinhold, ISBN 0–442–20578–3, Chapter 6, pp. 361–453 (175 pages).

Tummala, R. R., et al., [editors,] Microelectronics Packaging Handbook, Part II: Semiconductor Packaging, Chapman & Hall, 2nd edition 1997, Chapter 8, 179 pages.

Tummala, R. R., et al., [editors,] Microelectronics Packaging Handbook, Subsystem Packaging, Part III, Second Edition, Chapman & Hall, 1997, pp. 386–482 (112 pages).

Tummala, R. R., et al., [editors,] Microelectronics Packaging Handbook, Subsystem Packaging, Part III, Second Edition, Chapman & Hall, 1997, pp. 245–339 (94 pages).

Tummala, R. R., et al., [editors,] Microelectronics Packaging Handbook, Technology Drivers, Part I, Second Edition, Chapman & Hall, 1997, Ch. 5.5, pp. 457–508; 8.3, pp. 137–195 (124 pages).

Tsukada, Y., et al., "Surface Laminar Circuit Packaging", 0569–5503/92/0000–0022, pp. 22–27 (6 pages).

TOKO Datasheet, CMOS LDO, GC3–J024E, p. 1–35.

TWI Technology Engineering, Primary Encapsulants 'Glob top', downloaded from Internet, http://www.twi.co.uk/content/tfglobtp.html, Jul. 2010, 1 page.

Texas Instruments Incorporated 1997, "TMS320C30 Digital Signal Processor," Production Data (brochure), SPRS032A Apr. 1996, Revised Jun. 1997, 54 pgs.

Van Ierssel, Marcus Henricus "Circuit Techniques for High–Speed Serial and Backplane Signaling", thesis submitted in conformity with the requirements for the degree fo Doctor of Philosophy, Department of Electrical and Computer Engineering, University of Toronto, 2007, pp. 13, 65, 66, and 75 (5 pages.

Watkinson, John, "The Art of Digital Audio—Third Edition", Focal Press, An imprint of Elsevier, first published 1988, third edition 2001 (2 pages).

Voorman, J. O., et al., "A One–Chip Automatic Equalizer for Echo Reduction in Teletext", IEEE Transactions on Consumer Electronics, vol. CE–27, No. 3, Aug. 1981, pp. 512–529.

Vardaman, E. Jan, TechSearch International, Inc., Global Flip Chip Business Overview, 2004, 36 pages.

Vestling, et al., "A Novel High–Frequency High–Voltage LDMOS Transistor Using an Extended Gate Resurf Technology", 0–7803–3993–2/97, IEEE, 1997, pp. 45–48 (4 pages).

Wei, Derrick Chunkai, et al., "A 300MHz Mixed–Signal FDTS/DFE Disk Read Channel in 0.6 μm CMOS", ISSCC 2001/Session 12/Signal Processing for Storage Coding/12.4, 2001 IEEE International Solid–State Circuits Conference, 0–7803–6608–5, (3 pages).

Wei, Derrick Chunkai, et al., "A 300–MHz Fixed–Delay Tree Search–DFE Analog CMOS Disk–Drive Read Channel", IEEE Journal of Solid–State Circuits, vol. 36, No. 11, Nov. 2001, pp. 1795–1796 (2 pages).

Wong, et al., "A 50 MHz Eight–Tap Adaptive Equalizer for Partial–Response Channels", IEEE Journal of Solid–State Circuits, vol. 30, No. 3, Mar. 1995, pp. 228–234 (7 pages).

Wei, Gu–Yeon, et al., "A Fully Digital, Energy–Efficient, Adaptive Power–Supply Regulator", IEEE Journal of Solid–State Circuits, vol. 34, No. 4, Apr. 1999, pp. 520–529 (9 pages).

White Electronic Designs, Chip On Board Assembly, http://www.whiteedc.com/chip–on–board.html, obtained from internet 2010 (2 pages).

Widlar, Robert J., "New Developments in IC Voltage Regulators", IEEE Journal of Solid–State Circuits, vol. sc–6, No. 1, Feb. 1971, pp. 2–7 (6 pages).

Wilson, Syd R., et al., "Handbook of Multilevel Metallization for Integrated Circuits", Noyes Publication, ISBN 08155–1340–2, 1993 (5 pages).

Gauen, Kim, "Designing with TMOS Power MOSFETs", Motorola Semiconductor Products, Inc., AN–913 Application Note, 1983, pp. 1–19 (19 pages).

Shapiro, A., et al., "Electronic Packaging for Extended Mars Surface Missions", obtained from Internet http//www/trs–new.jpl.nasa.gov/dspace/bitstream/2014/38188/1/03–3098.pdf, 2010, 23 pages.

Fallon, Kenneth M., "Flip Chip Attach Solder Deposition Alternatives", IBM Microelectronics Division, Endicott, NY, pp. 310–318, 1996.

Robertson, Dave, "Selecting Mixed–Signal Components for Digital Communication System—An Introduction", Analog Diaglogue, 30–3, 1996, 24 pages.

Norsworthy, Steven R. et al., "Delta–Sigma Data Converters", IEEE Circuits and Systems Society, The Institute of Electrical and Electronics Engineers, New York, 1997, ISBN 0–7803–1045–4, IEEE Order No. PC3954, 6 pages.

Zhang, Hui, et al., "Low–Swing Interconnect Interface Circuits", obtained from Internet, IEEE Xplore, Jun. 1, 2010, 6 pages.

Zhang, S., et al., "A new approach to flip chip on board technology using SMT compatible processes", Microelectronics International 16/3 (1999), MCB University Press (ISSN 1356–5362), pp. 39–42, 4 pages.

A. Bessemoulin, M. Parisot, P. Quentin, C. Saboureau, M. van Heijningen and J. Priday, "A 1–Watt Ku–band Power Amplifier MMIC using Cost–effective Organic SMD Package," 34th European Microwave Conference, Amsterdam, 2004, pp. 349–352.

Abdellatif Elmonznin et al., "The Smart Power High–Side Switch: Description of a Specific Technology, Its Basic Devices, and Monitoring Circuitries," IEEE Transactions on Electron Devices, vol. 37, No. 4, Apr. 1990, pp. 1154–1161.

Alain Dravet, Didier Desplan, Nathalie Haese and Pierre Alain Rolland, "Flip Chip and Tab Interconnects for Millimeter Wave MMICs: A Comprehensive Study," GAAS 98, Amsterdam, 1998, pp. 656–661.

Andreas Schubert et al., "Do Chip Size Limits Exist for DCA?," IEEE Transactions on Electronics Packaging Manufacturing, Oct. 1999, vol. 22, No. 4, pp. 255–263.

Anthony Tsui et al, "Direct Interconnect: New MOSFET Package Cuts On–Resistance," PCIM Power Electronic Systems, Aug. 1999, pp. 20–30.

BSAC IP Practices Statement, www–bsac.eecs.berkeley.edu/about/ip.html?PHPSESSID=22. (2 pages).

C. G. Steyn and Jacobus D. van Wyk, "Study and Application of Nonlinear Turn–Off Snubber for Power Electronic Switches," IEEE Transactions on Industry Applications, vol. 1A–22, No. 3, May 1986, May/Jun. 1986, pp. 471–477.

Daniel R. Gamota and Cindy M. Melton, "Advanced Encapsulant Systems for Flip–Chip–on–Board Assemblies: Underfills with Improved Manufacturing Properties," IEEE Transactions on Components, Packaging, and Manufacturing Technology, Part C, vol. 21, No. 3, Jul. 1998, pp. 196–203.

David B. Lidsky, "The Conceptual–Level Design Approach to Complex Systems", (Fall 1998) (unpublished M.S. dissertation, University of California, Berkeley) (on file with author), pp. 1–220.

Dennis A. Jarc and Donald W. Novotny, , "A Graphical Approach to AC Drive Classification," IEEE Transactions on Industry Applications, vol. IA–23, No. 6, Nov. 1987 Nov./Dec. 1987, pp. 1029–1035.

Ernst Habekotté et al., "A Coplanar CMOS Power Switch," IEEE Journal of Solid–State Circuits, vol. SC–16, No. 3, Jun. 1981, pp. 212–226.

F&K Delvotec, "Chip–on–Board Technology," Apr. 4, 2007, http://www.fkdelvotec.at/press.php. (9 pages).

F. Pulvirenti et al., "Charger Power Switch for Mobile Phones," Analog and Mixed IC Design, 1997 Proceedings, 1997 2nd IEEE–CAS Region 8 Workshop on, Sep. 12–13, 1997, pp. 97–100.

Fairchild Semiconductor "FDMF8704: High Efficiency / High Frequency FET plus Driver Multi–chip Module," Rev G., Fairchild Semiconductor Corporation, Nov. 2007, pp. 1–10.

Frederick E. Sykes, "Resonant–mode power supplies: a primer," 0018–9235/89/0500–0036, IEEE Spectrum, May 1989, vol. 26, Issue: 5, pp. 36–39.

Free Online Encyclopedia, "chip on board definition of chip on board," http://encyclopedia2.thefreedictionary.com/chip+on+board, downloaded Mar. 3, 2010. (2 pages).

Gonzalo Casaravilla and Fernando Silveira, "Emitter Drive: A Technique to Drive a Bipolar Power Transistor Switching at 100kHz", Colloquium in South America, 1990., Proceedings of the 1990 IEEE, pp. 188–192.

Grace O'Malley, "The Importance of Material Selection for Flip Chip on Board Assemblies," IEEE Transactions on Components, Packaging, and Manufacturing Technology, Part B, vol. 17, No. 3, Aug. 1994, pp. 248–255.

H. W. van der Broeck et al., "On the steady–state and dynamic characteristics of bipolar transistor power switches in low–loss technology," Electric Power Applications, IEE Proceedings B 132 , Sep. 1985 vol. 132 , Issue:5, pp. 251–259 IEE Proceedings, vol. 132, Pt. B, No. 5, Sep. 1985, pp. 251–259.

IEEE Standard Dictionary of Electrical & Electronics Terms, Second Edition Revised and Expanded, IEEE Std 100–1977, Published by The Institute of Electrical and Electronics Engineers, Inc. 19777 p. 197—dominant mode dot signal; p. 510—potier reactance through power active; p. 694—sweep–delay accuracy through switchboard lamp. (6 pages).

IEEE Standard Dictionary of Electrical and Electronics Terms, ANSI/IEEE Std. 100–1988 Fourth Edition, 1988, published by the Institute of Electrical and Electronics Engineers, Inc. p. 287—dopant through double circuit systems; p. 717–potentiometer, grounded through power; p. 718—power, active through power, active; p. 728—power rectifier transformer through power system emergency; p. 972—sweep, free– running through switchboard cord. (8 pages).

Infineon Technologies, "TDA21201: Integrated Switch (MOSFET Driver and MOSFETs)," Infineon Technologies AG., Preliminary Data Sheet, Apr. 29, 2002, downloaded from www.DatasheetCatalog.com (16 pages).

Intel®, "Mobile Pentium® II Processor at 233 MHz, 266 MHz, And 300 MHz," Intel Corporation 1998, Order No. 243669–002. (75 pages).

Intel®, "Pentium® III Processor for the PGA370 Socket at 500 MHz to 1.13 GHz," Datasheet, Revision 8, Jun. 2001, Document No. 245264–08, (94 pages).

International IOR Rectifier, iPOWIR™ Technology, "PD–60325 iP2005APbF: High Frequency Synchronous Buck Optimized LGA Power Stage: Integrated Power Semiconductors, Driver IC, & Passives," www.irf.com, Feb. 8, 2008. (18 pages).

International IOR Rectifier, iPOWIR™ Technology, "PD–94568A iP2002: Synchronous Buck Multiphase Optimized BGA Power Block: Integrated Power Semiconductors, Drivers & Passives," www.irf.com, Mar. 20, 2003. (12 pages).

IPIRA Office of Intellectual Property & Industry Research Alliances University of California, Berkeley, UC Patent Policy, Sep. 4, 1997, www.ucop.edu/ott/genresources/pat–pol_97.html. (5 pages).

J. Fjelstad, et al., "Compliancy Modeling of an Area Array Chip Scale Package", Proceedings, Surface Mount International, San Jose, CA, Sep. 10–12, 1996, vol. 1, pp. 236–243.

J. Galière, J. L. Valard, E. Estèbe, "Millemetre–wave MMIC packaging compatible with surface–mount technology (SMT)," 12th GAAS Symposium, Amsterdam, 2004, pp. 591–594.

J. Giesler et al., "Flip Chip on Board Connection Technology: Process Characterization and Reliability," IEEE Transactions on Components, Packaging, and Manufacturing Technology, Part B, vol. 17, No. 3, Aug. 1994, pp. 256–263.

J. R. Wilcox, "Package Interconnects," (Presentation) IBM Corporation, Jan. 2006, pp. 1–108.

J. S. T. Huang et al., "VIB–3 Bidirectional Lateral Insulated Gate Transistors Operated in Controlled Latchup Mode," IEEE Transactions on Electron Devices, vol. 35, No. 12, Dec. 1988, pp. 2458.

James M. Smith and Stanley M. Stuhlbarg, "Hybrid Microcircuit Tape Chip Carrier Materials/Processing Trade–Offs," IEEE Transactions on Parts, Hybrids, and Packaging, vol. 13, No. 3, Sep. 1977, pp. 257–268.

Jean–Paul Clech and Joseph Fjelstad, "Reliability Prediction Modeling of Area Array CSPs," Electronic Packaging Solutions International, Inc., Jun. 1997, pp. 91–96.

Jess Brown et al., "Novel Trench Gate Structure Developments Set the Benchmark for Next Generation Power MOSFET Switching Performance," PCIM Europe 2003 International Conference and Exhibition, May 22–22, 2003. Nuremberg, Germany. (4 pages).

John H. Lau, "Cost Analysis: Solder Bumped Flip Chip Versus Wire Bonding," IEEE Transactions on Electronics Packaging Manufacturing, vol. 23, No. 1, Jan. 2000, pp. 4–11.

John H. Lau, editor, Handbook of Tape Automated Bonding, Van Nostrand Reinhold, 1992, ISBN 0–442–00427–3. (336 pages).

John H. Lau, Flip Chip Technologies, McGraw–Hill, 1996, ISBN 0–07–036609.8. (298 pages).

John H. Lau, Low Cost Flip Chip Technologies for DCA, WLCSP, and PBGA Assemblies, McGraw–Hill, 2000, ISBN 0–07–135141–8. (307 pages).

John Lau et al., Electronic Packaging, Design, Material, Process and Reliability, McGraw–Hill, 1998, ISBN 0–07–037135–0. (262 pages).

Jung H. Hur et al., "GaAs–Based Opto–Thyristor for Pulsed Power Applications," IEEE Transactions on Electron Devices, vol. 37, No. 12, Dec. 1990, pp. 2520–2525.

Kimihiro Muraoka et al., "Characteristics of the High–Speed SI Thyristor and Its Application to the 60–kHz 100–kW High–Efficiency Inverter," IEEE Transactions on Power Electronics, vol. 4, No. 1, Jan. 1989, pp. 92–100.

L. S. Goldmann, "Geometric Optimization of Controlled Collapse Interconnections*," IBM Journal of Research and Development, vol. 13 No. 3, pp. 251–265.

Larry Gilg, "Challenges in Bare Die Mounting," Die Products Consortium, Austin, Texas, www.dieproducts.org/tutorials/assembly/bare_die_mounting.pdf. pp. 1–8.

Lars S. Nielsen et al., "Low–Power Operation Using self–Timed Circuits and Adaptive Scaling of the Supply Voltage," Special Issue Papers, IEEE Transactions on Very Large Scale Integration (VLSI) Systems, vol. 2, No. 4, Dec. 1994, pp. 391–397.

Lautaro D. Salazar and Phoivos D. Ziogas, "A High Frequency Two–Switched Forward Converter with Optimized Performance," Industrial Electronics Society, 1989. IECON '89., 15th Annual Conference of IEEE, Nov. 6–10, 1989, pp. 60–66 vol. 1.

Lishan Tu et al., "Performance Characteristics of the Combined Zero–Voltage Switching Inverter with the Auxiliary Input–Current Controller," Proceeding of the Power Conversion Conference—Nagaoka 1997., Aug. 3–6, 1997, vol. 2, 827–830 0/7803–3823–5/97, IEEE 1997, pp. 827–830.

M. van Heijningen and J. Priday, "Novel Organic SMD Package for High–Power Millimeter Wave MMICs," 34th European Microwave Conference, Amsterdam, Oct. 11–15, 2004, pp. 357–360.

Maxim, "Digitally Adjustable LCD Bias Supply," MAX749, Maxim Integrated Products (brochure) 19–0143; Rev. 1: 2/95, Feb. 1995, pp. 1–12.

McGraw–Hill Dictionary of Electronic and Electrical Engineering, McGraw–Hill Book Company, 1984, p. 164—flasher through flip chip; p. 165—flip call through flutter echo; p. 220—instantaneous companding through insulation; p. 221—insulation coordination through intensifier electrode. (5 pages).

McGraw–Hill Dictionary of Scientific and Technical Terms, Fourth Edition 1989, p. 556—disconformity through dishpan experiment. (4 pages).

McGraw–Hill Electronics Dictionary, Fifth Edition, John Markus and Neil Sclater Editors, 1994, p. 65—BT–cut crystal through bulk eraser; p. 110—concentric transmission line through confidence interval, p. 114—continuous X–rays through control system; p. 119—counter circuit through coupling coefficient; p. 207–FES through field–effect transistor; p. 230—gas–cell frequency standard through gate; p. 231—gate array through G display; p. 333—mesa transistor through metal–organic vapor–phase epitaxy; p. 494—solar through soldering iron; p. 573—VHF antenna through videocassette recorder; p. 578—voltage generator through voltmeter. (14 pages).

McGraw–Hill Electronics Dictionary, Fifth Edition, John Markus, Neil Sclater, 1984, p. 578—voltage generator through voltmeter; p. 494—solar flare through soldering iron. (5 pages).

MOSPOWER Applications Handbook, Robin Berliner Editor, 1984, Siliconix Incorporated, p. 2–3.

National Semiconductor Corporation, "LM2650 Synchronous Step–Down DC/DC Converter", Jun. 1999. (11 pages).

National Semiconductor, "LM1575/LM2575/LM2575HV: Simple Switcher® 1A Step–Down Voltage Regulator," National Semiconductor Corporation, Apr. 2007. (28 pages).

National Semiconductor, LM2650 Synchronous Step–Down DC/DC Converter, Jan. 1997, (12 pages).

National Semiconductor, News Release, "National Semiconductor Announces Industry's First 3 AMP Monolithic Synchronous Battery Switcher with Greater than 96% Efficiency", downloaded on Jul. 30, 2009 from http://www.national.com/news/1996/9609/lm2650.html, (2 pages).

National Semiconductor: The Sight & Sound of Information, "Considerations in Converting from SMT to Die Assemblies," National Semiconductor Technical Seminar Series, Die Product Business Unit, Jun. 26, 2003. (38 pages).

New Webster's Dictionary of the English Language, College Edition, 1975, p. 448—disconcerted through discrepancy, p. 821—japan through jute; p. 1137—plainsman through plane tree; p. 1786—witchery through without. (7 pages).

O. K. Mawardi et al., "High Voltage Superconducting Switch for Power Application," IEEE Transactions of Magnetics, vol. Mag–19, No. 3, May 1983, pp. 1067–1070.

Ole Bentz et al. "A Dynamic Design Estimation and Exploration Environment", Department of Electrical Engineering and Computer Science, University of California, Berkeley, Proceedings of the 34th Design Automation Conference, 1997, IEEE 1997. pp. 190–195.

Ole Bentz et al., "Information Based Design Environment", University of California, Berkeley, Workshop on VLSI Signal Processing, VIII, 1995. IEEE Signal Processing Society, Oct. 16–18, 1995, p. 237–246 IEEE 1995, pp. 237–246.

Paul Horowitz and Winfried Hill, The Art of Electronics: Second Edition, Cambridge University Press, 2006, pp. 321–322: Chapter 6 Voltage Regulators and Power Circuits, Section 8; p. 341–345; Chapter 6, Section 16 through Section 18; p. 819: Chapter 11 Microprocessor Support Chips, Section 12. (11 pages).

Peter P. Balthasar and Eberhart Reimers, "The Integrated Power Switch," IEEE Transactions on Industry Applications, vol. 1A–12, Mar./Apr. 1976, pp. 179–191.

Primarion, "PX7510: Single–phase Digital Integrated Power Conversion & Management IC," Di–POL™, Product Brief, Nov. 17, 2006. (2 pages).

Primarion® Power Code™, "Digital Multiphase Chipset*," Primarion® Wideband Power Products, Product Brief, 2003. (2 pages).

R. A. Petr, W. C. Nunnally and C. V. Smith, Jr., "Switching performance of a cryogenic silicon photoconductive power switch," J. Appl. Phys. 63 (8), Apr. 15, 1988, American Institute of Physics, pp. 2839–2847.

R. Jacob Baker et al., CMOS Circuit Design, Layout and Simulation, IEEE Press, 1998, ISBN 0–7803–3416–7. (468 pages).

R. Jacob Baker et al., CMOS Circuit Design, Layout and Simulation, Second Edition, IEEE Press, 2005, ISBN 978–81–265–203–4. (541 pages).

Rao R. Tummala, Microelectronics Packaging Handbook, Semiconductor Packaging, Part II, Second Edition, Kluwer Academic Publishers, Chapman & Hall, 1997, ISBN 0–412–08431–7. (535 pages).

Renesas, "R2J20602NP: Integrated Driver MOS FET (DrMOS)," Renesas Technology Corp., Fact Sheet Rev 4.00, Feb. 9, 2009. (15 pages).

Request for grant of a patent—The Patent Office London, Patent Application No. 9724597.1, Nov. 20, 1997, entitled "Controller For Battery–Operated Vehicle".

Richard S. Muller, Device Electronics for Integrated Circuits, Second Edition, John Wiley & Son, Inc., 1977, ISBN 0–471–88758–7. (276 pages).

Robert B. Hood, "Proposed Integrated Circuit for Appliance or Process Control," IEEE Transactions on Industry and General Appications, vol. IGA–4, No. 5, Sep. 1968, pp. 520–526.

S. M. Varosi et al., "A Simple Remote–Controlled Power Switch for Internalized Bioelectronic Instrumentation," IEEE Transactions on Biomedical Engineering, Aug. 1989, vol. 36, Issue:8, pp. 858–860.

Scott E. Deering and Julian Szekely, "Mathematical Modeling of Alternative Pad Designs in Flip–Chip Soldering Processes," Journal of Electronic Materials, vol. 23, No. 12, Dec. 1994, pp. 1325–1334.

Shin'ichiro Mutoh et al., "Design Method of MTCMOS Power Switch for Low–Voltage High–Speed LSIs,"Design Automation Conference, 1999. Proceedings of the ASP–DAC '99. Asia and South Pacific Jan. 18–21, 1999, 113–116 vol. 1.

Sidney Soclof, Analog Integrated Circuits, Prentice–Hall, Inc., 1985, ISBN 0–13–032772–7. (264 pages).

Sidney Soclof, Analog Integrated Circuits. Prentice–Hall Series in Solid State Physical Electronics, Prentice Hall, Inc. 1985, p. 44. (4 pages).

Siliconfareast.com, "Chip–on–Board (COB); Direct Chip Attachment (DCA)," http://www.siliconfareast.com/cob.htm, downloaded Mar. 3, 2010. (3 pages).

Stephen Hobrecht, "An Intelligent BiCMOS/DMOS Quad 1–A High–Side Switch," IEEE Journal of Solid–State Circuits, vol. 25, No. 6, Dec. 1990, pp. 1395–1402.

Sue Chen and Joós Géza, "Series and Shunt Active Power Conditioners for Compensating Distribution System Faults," IEEE Canadian Conference on Electrical and Computer Engineering, Conference Proceedings vol. 2, May 7–10, 2000, pp. 1182–1186.

Sujit K. Biswas et al., "IGBT–Bipolar Discrete Darlington Power Switches: Performance and Design", Industry Applications Society Annual Meeting, 1991., Conference Record of the 1991 IEEE, Sep. 28–Oct. 4, 1991, vol. 2, pp. 1483–1489.

Suwanna Jittinorasett, "UBM Formation on Single Die/Dice for Flip Chip Applications," (Aug. 25, 1999) (unpublished M.S. dissertation, Virginia Polytechnic Institute and State University), http://scholar.lib.vt.edu/theses/available/etd–082699–110209/unrestricted/Final.pdf. pp. 1–89.

T. A. Smith and S. Dimitrijev, "Using the On–Resistance of a Power MOSFET to Control a DC–DC Converter," Circuits and Systems, 1998. IEEE APCCAS 1998. The 1998 IEEE Asia–Pacific Conference on, Nov. 24–27, 1998, pp. 731–733.

T. Paul Chow and B. Jayant Baliga, "A New Hybrid VDMOS–LIGBT Transistor," IEEE Electron Device Letters, vol. 9, No. 9. Sep. 1988, pp. 473–475.

T. Tsen et al., "A Low Power 16K GaAs HIMESFET static RAM with Built–in Redundancy," Gallium Arsenide Integrated Circuit (GaAs IC) Symposium, 1990, Oct. 7–10, 1990, pp. 155–157 Technical Digest 1990., 12th Annual Rockewell International Corporation MTC/CSP, GaAs IC Symposium, pp. 155–157.

Tessera: System Building Block, "The Tessera μBGA package," Product Description. 1994.

The American Heritage Dictionary, Second College Edition, 1982, pp. 817—motionless through mountainer; p. 1384—wind instrument through wing footed. (5 pages).

The Authoritive Dictionary of IEEE Standards Terms, Seventh Edition, IEEE, 2000, p. 275—day night sound level through d–display. (6 pages).

The IEEE Standard Dictionary of electrical and Electronics Terms, Sixth Edition, IEEE Std 100–1996, 1996, p. 313—done correct through dose equivalent; p. 536—integer arithmetic through circuit; p. 537—integrated Civil Engineering System through integration loss; p. 557—isochronous service octet through isolation; p. 650—metal—enclosed power switchgear through metal–oxide semiconductor; p. 808—power–selsyn through power transfer relay; p. 818—principal voltage through print server; p. 1054—strip–type transmission line through structure chart; p. 1059—substitute character through subtransient internal voltage. (12 pages).

The IEEE Standard Dictionary of electrical and Electronics Terms, Sixth Edition, IEEE Std 100–1996, 1996, p. 313—done correct through dose equivalent; p. 408—fill area through filter; p. 409—filter, active through filter trasnmission band; p. 526—input queue through insertion loss ripple; p. 535—insulation, temperature class ratings through integer adjectives; p. 536—integer arithmetic through integrated circuit; p. 537—integrated Civil Engineering System through integration loss; p. 544 interlacing impedance voltage through intermediate frequency; p. 557—isochronous service octet through isolation; p. 650—metal—enclosed power switchgear through metal–oxide semiconductor; p. 734—output signal through overcurrent; p. 808—power selsyn through power transfer relay; p. 818—principal voltage through print server; p. 1054—strip–type transmission line through structure chart; p. 1059—substitute character through subtransient internal voltage; p. 1095—10BASE2 through terminal; p. 1096—terminal adapter through terminal, remote. (20 pages).

The New IEEE Standard Dictionary of Electrical and Electronics Terms [Including Abstracts of All current IEEE Standards], 1993, p. 802—metal—enclosed 1000 volts through metallic rectifier; p. 803—metallic rectifier cell through meter installation inspection; p. 995– power service protector through power system stabilizer. (5 pages).

Thomas M. Frederiksen, Intuitive IC Electronics, A Sophisticated Primer for Engineers and Technician, McGraw–Hill Book Company, 1982, ISBN 0–07–021923–0. (104 pages).

Trevor A. Smith et al., "Controlling a DC–DC Converter by Using the Power MOSFET as a Voltage Controlled Resistor," IEEE Transactions on Circuits and Systems–I: Fundamental Theory and Applications, vol. 47, No. 3, Mar. 2000, p. 357–362.

University of California Technology Transfer, UC Patent Policy 1985, Effective Nov. 18, 1985, http://www.ucop.edu/ott/genresources/pat–pol__97.html (4 pages).

Webster's Ninth New Collegiate Dictionary, 1991, p. 1176—sub–script through substitutable. (3 pages).

Webster's Third New International Dictionary of the English Language Unabridged, Merriam–Webster Inc., Publisher, 1993, page_altaic through altitude; p. 485—consonancy through constellate; page_continental through continuous; p. 494—continuous beam through contractions; p. 646—discomycete through discourage; p. 1275—last day through lateral line; page_mottled through mount; p. 1477—mount through mountain pride; p. 1575—on through one; page_ plan through planful; p. 1730—plan through planful; page 1730—plant through planful; page_plunge through plutonic; page_protozoacidal through provenience; p. 230—sureness through surgeon general; p. 2620 windfallen through wind–shaken; p. 2627—wither through witted. (19 pages).

Webster's Third New International Dictionary of the English Language, Unabridged, Merriam–Webster Inc., Publishers, 1993, page_altaic through altitude; page_—arnhem through array; p. 121—arrayal through arrowhead; page_—conjugal bliss through connected load; page_—continental drift through continuous; p. 494—continuous beam through contraction; page_—ed through edict; p. 804—expurgation through extension; page_—F through face; p. 1275—last day through lateral line; page_mottled through mount; p. 1477—mount through mountain pride; p. 1575—on through one; page_over frame through ovelook; p. 1608—overflow pipe through ovelook; page_—packet through pad; page 1619—pad through paedomorphism; page_—plan through planful; p. 1730—plan through planful; page_—plunge through plutonic; page_—protozoacidal through provenience; p. 2280—susbstandard through subsumption; p. 2500—union card through united front; p. 2620 windfallen through wind–shaken; p. 2627—wither through witted. (28 pages).

Wikipedia, the free encyclopedia, "Pentium III," http://en.wikipedia.org/wiki/Pentium_III, last modified Nov. 16, 2007. (6 pages).

William C. Dunn, "Driving and Protection of High Side NMOS Power Switches," IEEE Transactions on Industry Applications, vol. 28, No. 1, Jan./Feb. 1992, pp. 26–30.

William D. Brown, "Advanced Electronic Packaging With Emphasis on Multichip Modules," IEEE Press Series on Microelectronic Systems, Stuart K. Tewksbury, Series Editor, IEEE Computer Society Press, Oct. 13, 1998, the Institute of Electrical and Electronics Engineers, Inc. New York. (415 pages).

William G. Hawkins, "Power IC's Move Ink Jet Printers to New Performance Levels", Electron Devices Meeting, 1995, International, Dec. 10–13, 1995, p. 959–962.

Won Namgoong et al., "SP23.2: A High–Efficiency Variable–Voltage CMOS Dynamic dc–dc Switching Regulator," IEEE International Solid–State Circuits Conference, 1997, pp. 381–381 and 489.

Wong Da Feng, "Diode as Pseudo Active Switch in High Frequency Narrowband DC/DC Converter," Power Electronics Specialists Conference, 1991. PESC '91 Record, 22nd Annual IEEE, Jun. 24–27, 1991, pp. 182–185.

Yida Zou et al., "In–Situ Stress State Measurements During Chip–on–Board Assembly," IEEE Transactions on Electronics Packaging Manufacturing, vol. 22, No. 1, Jan. 1999, pp. 38–52.

Frear, D., *Issues Related to the Implementation of Pb–Free Electronic Solders In Consumer Electronics*, "J. Mater. Sci.: Mater. Electron," (2007), 18: 319–330.

Gilleo, Ken, *Direct Chip Interconnect Using Polymer Bonding*, "IEEE Transactions on Hybrids, Packaging, and Manufacturing Technology Society," vol. 13. No. 1. Mar. 1990, pp. 229–234.

Harper, C. A., editor, *Electronic Packaging and Interconnection Handbook*, McGraw–Hill, 1991, p. 6.64–6.71.

Hnatek, Eugene R., *Integrated Circuit Quality and Reliability*, second edition, Marcel Dekker, 1995, pp. 99–175, 293–307.

Intel. *DrMOS Specifications*, Nov. 2004, Revision 1.0. 17 pages.

Lau, John H., editor, *Flip Chip Technologies*, McGraw–Hill, 1995, pp. 26–28, 411–413, 499–515, 526–527.

Lau, John H. et al., *Electronic Packaging: Design, Material, Process, and Reliability*, McGraw–Hill, 1998, pp. 13–14.

*McGraw–Hill Dictionary of Electronic and Electrical Engineering*, McGraw–Hill Book Company, 1984, pp. 164 and 221.
*McGraw–Hill Dictionary of Scientific and Technical Terms*, McGraw–Hill Book Company, fifth edition, 1994, p. 1027.
Motorola, *Linear/Switchmode Voltage Regulator Handbook*, 1989, pp. 95–100.
Muller, Richard S. et al., *Device Electronics for Integrated Circuits*, John Wiley & Sons, second edition, 1986, pp. 106–107.
Murari, Bruno et al., *Smart Power ICs: Technologies and Applications*, Itoh, K. et al., editors, "Springer Series in Advanced Microelectronics," Springer 2002 (a corrected printing of the 1st edition from 1996). p. 483–506.
Paik, Kyung–Wook et al., *A Study On Reliability Of Flip–Chip Solder Joints Using Pb–Free Solders And Electroless Ni–P UMBs*, "Proceedings, SMTA Pan Pacific Symposium," 2005. 7 pages.
Seraphim, Donald P., et al., *Principles of Electronic Packaging*, McGraw–Hill, 1989, pp. 595–598.
Takahashi, Yasuo et al., *Microjoining process in electronics packaging and its numerical analysis*, "Transactions, JWRI," vol. 30, No. 1, 2001, pp. 1–11.
Tessier, Ted and Scott, Doug, editors, *Bumping Design Guide*, Flip Chip International LLC, May 2009. 53 pages.
Tummala, R. R., editor, *Microelectronics Packaging Handbook*, Van Nostrand Reinhold, 1989, pp. 364–373.
Tummala, R. R., et al., [editors,] *Microelectronics Packaging Handbook, Part II: Semiconductor Packaging* Chapman & Hall, 2nd edition 1997, pp. 117–119, 935–937.
Acker, Brian et al., Brian et al., "Synchronous Rectification with Adaptive Timing Control," Dept. of Electrical Engineering and Comp. Sciences, University of California, Berkeley 1995. IEEE ISBN 0 7803 2730 6. pp. 88–95.
Dixon, Lloyd, "Average Current Mode Control of Switching Power Supplies," Unitrode Switching Regulated Power Supply Design Seminar Manual, Unitrode Corporation, C1–1 to C1–14, 1991 (16 pages).
Dixon, Lloyd, "Switching Power Supply Topology Review," Unitrode Switching Regulated Power Supply Design Seminar Manual, Unitrode Corporation, P1–1 to P1–12, 1991. (14 pages).
élantec EL7556C Adjustable CPU Power Supply Unit, élantec High Performance Analog Integrated Circuits, Inc. (product description brochure) 13 pgs [1189–1201].
Farley, B. G. and Clark, W.A. "Simulation of Self–Organized Systems by Digital Computer," Lincoln Laboratory at MIT, Cambridge, MA, 1954. Downloaded by licensed user from IEEE Xplore on Dec. 15, 2008, 9 pgs [1035–1043].
Kassakian et al., "Form and Function: An Overview, Chapter 2; 2.3 DC/DC Converters" Principles of Power Electronics, Addison–Wesley Publishing Co. pp. 20–23, 1991.
Kassakian et al., "Discrete–Time or Sampled–Data models," *Principles of Power Electronics*, Addison–Wesley Publishing Co., Chapter 12, Sec. 12.5, pp. 313–315, 1991.
Kassakian et al., "Dynamics and Control: An Overview," *Principles of Power Electronics*, Addison–Wesley Publishing Co., Chapter 11, pp. 253–298, 1991.
Kassakian et al., "Feedback Control Design," *Principles of Power Electronics*, Addison–Wesley Publishing Co., Chapter 14, pp. 365–402, 1991.
Kassakian et al., "High–Frequency Switching dc/dc Converters," Principles of Power Electronics, Addison–Wesley Publishing Co., Chapter 6, pp. 103–137, 1991.

Linear Technology, "Offline Switching Regulator," (product description brochure) LT1103/LT1105, 32 pgs [1241–1272].
Sridharan, G. Oct. 1990. "Transformerless DC/DC Converter for Production of High Voltage," downloaded on Dec. 11, 2008 from IEEE Xplore, by licensed user, 3 pgs [1709–1711].
Stratakos, Anthony J. (1998) "High–Efficiency Low–Voltage DC–DC Conversion for Portable Applications," Dissertation No. UMI 9923062, Univ. CA, Berkeley, Dec. 2, 1998, 251 pgs [1800–2050].
Wei, Gu–Yeon and Horowitz, Mark,"A Low Power Switching Power Supply for Self–Clocked Systems," Computer Systems Laboratory, Stanford University, CA, funding provided under ARPA, contract #I–FBI–92–194, ISLPED 1996 Monterey, California, 5 pgs [4822–4826].
"FC–09A 2X2 mm MOSFET BGA Tape and Reel Dimensions," Mar. 2000, Rev A, Fairchild Semiconductor International. 4 pgs.
"FDZ202P: P–Channel 2.5V Specified Power Trench™ BGA MOSFET," Nov. 1999 Advance Information, Fairchild Semiconductor Corporation. 4 pgs.
"FDZ204P: P–Channel 2.5V Specified Power Trench® BGA MOSFET," Dec. 2000 Preliminary, Fairchild Semiconductor Corporation. 4 pgs.
"FDZ5047N: 30V N–Channel Logic Level Power Trench® BGA MOSFET," Dec. 1999 Advance Information, Fairchild Semiconductor Corporation. 4 pgs.
Allen, J.J. et al. (1998) "Integrated Micro–Electro–Mechanical Sensor Development for Inertial Applications," *1998 IEEE*, 0–7803–4330–1/98, 8 pgs [1021–1028].
Arbetter, Barry et al. (1997) "Control Method for low–Voltage DC Power Supply in Battery–Powered Systems with Power Management," *IEEE Power Electronics Specialists Conference*, St. Louis, MS, Jun. 22, 1997, 6 pgs [859–864].
Arbetter, Barry et al. (1997) "DC–DC Converter with Fast Transient Response and high Efficiency for Low–Voltage Microprocessor Loads," *IEEE Power Electronics Specialists Conference*, St. Louis, MS, Jun. 22–27, 1997, 8 pgs [865–872].
Arzumanyan, Aram, et al., "Flip Chip Power MOSFET: A New Wafer Scale Packaging Technique," As presented at ISPSD, Jun. 2001, International Rectifier Corporation. 4 pgs.
Asada, G. et al. (1997) "Low Power Wireless Communication and Signal Processing Circuits for Distributed Microsensors," *1997 IEEE Intnl Symposium on Circuits and Systems*, Jun. 9–12, 1997, Hong Kong, 2817–2820, 4 pgs [940–943].
Antencio, S. et al. (1999) "Design, Analysis, and Fabrication of the APT Cavities," *Proceedings of the 1999 Particle Accelerator Conference*, New York, 965–967, 3 pgs [1018–1020].
Bai, John G. et al. (2003) "Flip–Chip on Flex Integrated Power Electronics Modules for High–Density Power Integration," IEEE Transactions on Advanced Packaging, vol. 26, No. 1, Feb. 2003, 6 pgs [54–59].
Bandyopadhyay, A. et al. (1998) "A Simplified Approach to Time–Domain Modeling of Avalanche Photodiodes," *IEEE Journal of Quantum Electronics*, vol. 34, No. 4, Apr. 1998, 691–699, 9 pgs [989–997].
Bentz, Ole et al. (1995) "Information Based Desing Environment," *1995 IEEE* No. 0–7803–2612–1/95, 10 pgs [1627–1636].

Bentz, Ole et al. (1997) "A Dynamic Design Estimation and Exploration Environment," ACM, Inc., DAC 97, Anaheim, CA, ACM 0–89791–920–3/07/06, pp. 190–195, Jun. 9–13, 1997, 6 pgs [1607–1612].

Boustedt, Katarina (1998) "GHz Flip Chip—An Overview," *1998 IEEE*, No. 0–7803–4526–6/98, 6 pgs.

Brandenburg, S. and Yeh, S. (1998) "Electromigration Studies of Flip Chip Bump Solder Joints," Delphi Delco Electronics Systems, Kokomo, Indiana. In Proceedings Surface Mount International, 1998, San Jose, Calif., Aug. 23, 1998. 8 pgs.

Brodersen, R. et al. (1994) "Research Challenges in Wireless Multimedia," *PIMRC 1994*, P1.1, 1–5, 5 pgs [948–952].

Bult, K. et al. (1996) "Low Power Systems for Wireless Microsensors," ISLPED 1996 Monterey CA, 1996, 17–21, 5 pgs [935–939].

Burd, Thoams D. et al. (2000) "A Dynamic voltage Scaled Microprocessor System," *IEEE Journal of Solid–State Circuits*, vol. 35, No. 11, Nov. 2000, 10 pgs [1712–1721].

Burd, Thomas D. et al., "A Dynamic Voltage Scaled Microprocessor System," Solid–State Circuits Conference, Feb. 7–9, 2000. Paper 17.4. ISSCC. 2000 IEEE International. 20pp.

Burdio, Jose et al. (1995) "A Unified Discrete–Time State–Space Model for Switching ConvertErs," *IEEE Transactions on Power Electronics*, vol. 10, No. 6, Nov. 1995, 14 pgs [873–886].

Burstein, Amit et al. (1995) "Mixed Analog–Digital highly–Sensitive Sensor Interface Circuit for Low–Cost Microsensors," Ithe 8th Intnl Conf on Solid–State Sensors and Actuators and Eurosensors, Stockholm, Sweden, Jun. 25–29, 1995, 162–165, 4 pgs [944–947].

Burstein, Andrew et al. (1995) "The InfoPad user Interface," *IEEE 1995*, 1063–6390/159–162, 4 pgs [967–970].

Chandrakasan, Anantha et al. (1994) "A Low Power Chipset for a Portable Multimedia I/O Termainl," *IEEE Journal of Solid–State Circuits*, vol. 29, No. 12, Dec. 1994, 1415–1428, 12 pgs [892–905].

Chandrakasan, Anantha et al. (1994) A Low Power chipset for Portable Multimedia Applications, *1994 IEEE International Solid–State Circuits Conference*, ISSCC94, Session 5, Technology Directions: Low–Power Technology, Paper WP5.1, Feb. 16, 1994, 2 pgs [887–888].

Chandrakasan, Anantha et al. (1994) "Design of Portable Systems," *IEEE 1994 Custom Integrated circuits Conference*, No. 0–7803–1886–2/94, 8 pgs [1792–1799].

Chetty, P.R.K. (1986) "Switch–Mode Power Supply Design," *TAB Professional and Reference Books*, Division of TAB Books, Inc., 1986, 5pgs [971–975].

Clark, W.A. And Pelosi, W. (1990) "Area Distributed Soldering of Flexible and Rigid Printed Circuit Boards," *1990 IEEE*, 0148–6411/901200–0698, 6 pgs [1003–1008].

Cooley, G. M. And Fiez, Terri (1995) "PWM and PCM Techniques for Control of Digitally Programmable Switching Power Supplies," *1995 IEEE*, 0–7803–2570–2/95, 1114–1117, 4 pgs [1044–1047].

Dancy, Abram and Chandrakasan, Anantha (1997) "Ultra Low Power Control Circuit for PWM Converters," *1997 IEEE*, 0–7803–3840–5/97, 21–27, Jun. 22–27, 1997, 7 pgs [1152–1158].

Dancy, Abram P. (1996) "Power Supplies for Ultra Low Power Applications," Archives of the Massachusetts Institute of Technology, Oct. 29, 1997, 104 pgs [1048–1151].

Darwish, M. et al. (1998) "Scaling Issues in Lateral power MOSFETs," *Proc of 1998 Intnl Symposium on Power Semiconductor Devices and ICs*, Kyoto, 11.33/329–332, 4 pgs [1159–1162].

élantec (1996) EL7560C Programmable CPU Power Supply Unit, élantec High Performance Analog Integrated Circuits, Inc. (product description brochure) Jul. 1996, Rev. A, 12 pgs [1202–1213].

élantec (2000) EL7556AC Programmable CPU Power Supply Unit, élantec High Performance Analog Integrated Circuits, Inc. (product description brochure) Feb. 28, 2000, 13 pgs [1163–1175].

élantec (2001) EL7556BC Integrated Adjustable 6 Amp Synchronous Switcher, élantec High Performance Analog Integrated Circuits, Inc. (product description brochure) Oct. 5, 2001, 13 pgs [1176–1188].

Farley, B.G. et al. (1962) "Computer Techniques for the study of Patterns in the Electroncephalogram," *IRE Transactions on Bio–Medical Electronics*, Jan. 1962, 9 pgs [1009–1017].

Furukawa, T. et al. (1997) Accelerated Gate–Oxide Breakdown I Mixed–Voltage I/O Circuits, *1997 IEEE*0–7803–3575–9/97, Apr. 8, 1997, 169–173, 5 pgs [998–1002].

Gilbert, P. et al. (1998) "A high Performance 1.5V, 0.10 μm Gate Length CMOS Technology with Scaled copper Metallization," *1998 IEEE*, IEDM 98–1013, 4 pgs [978–981].

Goodman, James et al. (1998) "An Energy/Security Scalable Encryption Processor Using an Embedded Variable Voltage DC/DC Converter," *IEEE Jrnl of Solid–State Circuits*, vol. 33, No. 11, 1799–1809, Nov. 1998, 11 pgs [1390–1400].

Griffin, Timothy E. (1995) "Multichip Modules Including Processing, A Literature Survey," Army Research Laboratory, ARL–MR–257, No. 19950906–048, Aug. 1995, 26 pgs [1401–1426].

Gupta, Tarun et al. (1997) "Implementation of a Fuzzy Controller for DC–DC Converters Using an Inexpensive 8–b Microcontroller," *IEEE Trans on Industrial Electronics*, vol. 44, No. 5, Oct. 1997, 9 pgs [1427–1435].

Gutnik, Vadim and Chandrakasan, Anantha (1997) "Embedded Power Supply for Low–Power DSP," *IEEE Trans on Very Large Scale Integration (VLSI) Systems*, vol. 5, No. 4, Dec. 1997, 11 pgs [1436–1446].

Haralson, II et al. (1997) "Numerical Simulation of Avalanche Breakdown with In–P–InGaAs SAGCM Standoff Avalanche Photodiodes," *Journal of Lightwave Technology*, vol. 15, No. 11, Nov. 1997, 4 pgs [1029–1032].

HIP5020 Integrated–Power Buck Converter Controller with Synchronous Rectification, HARRIS Semiconductor (product description brochure) File No. 4253, Jan. 1997 (19–0146: Rev. 2: 5/94), 16 pgs [1214–1229].

Huliehel, F. and Ben__Yaakow, S. (1989) "Low–Frequency Sampled–Data Models of Switched Mode DC–DC Converters," *1989 IEEE*, CH2721–9/89/0000–0492, 8 pgs [1447–1454].

Joshi et al. (2000) "MOSFET BGA Package," *2000 IEEE*, Electronic Components and Technology Conference, No. 0–7803–5911–9/00, 4 pgs.

Jung, Erik et al. (1999) "Flip Chip Contacts for High Current Conducting Assemblies," *1999 IEEE*, 0–7803–5502–4/99, 7 pgs [1460–1466].

Jung, Sang–Hwa et al. (1999) "An Integrated CMOS DC–DC Converters," *1998 IEEE*, 0–7803–5421–4/99, 5 pgs [1455–1459].

Klein, Jon (2000) "Bumped–wafer technology meets MOSFET challenges," Retrieved from Electronic Products.com at <http://www.2.electronicproducts.com/printarticle.aspx?articleURL+SEPFAI1. SEP2000>, downloaded from internet on May 4, 2009, 4 pgs.

Koburger C. et al. (1994) "Simple, Fast, 2.5–V CMOS Logic with 0.25–μm Channel Length and Damascene interconnect," *1994 Symposium on VLSI Technology Digest of Technical Papers*, 7A.3, 0–7803–19212–4/94–IEEE, 2 pgs [1033–1034].

Kukrer, Osman (1996) "Discrete–Time Current Control of Voltage–Fed Three–Phase PWM," *IEEE Trans on Power Electronics*, vol. 11, No. 2, Mar. 1996, 10 pgs [1597–1606].

Kurata et al. (2000) "Over–coated Flip–chip Fine Package Development for MCM Fabricated with Si IC and GaAs MMIC," *2000 IEEE*, Electronic Components and Technology Conference, No. 0–7803–5911–9/00, 6 pgs.

Kurata et al. (2001) "Dual Operational Amplifier Using Flip–chip Fine Package of 1.0x1.0x0.6–mm with 8–pin counts," *2001 IEEE*, Electronic Components and Technology Conference, No. 0–7803–7038–4/01, 5 pgs.

Lau, John H. Ed. (1994)"Chip On Board Technologies for Multichip Modules," Chapman & Hall, New York, NY, International Thompson Publishing. ISBN 0442014414. 1994.(299 pgs).

Li, Jieli et al. (2004) "Using Coupled Inductors to Enhance Transient Performance of Multi–Phase Buck Converters," *2004 IEEE*, No. 0–7803–8269–2/04, 1289–1203, 5 pgs [2051–2055].

Lidsky, D. and Rabaey J.M. (1994) "Low Power Design of Memory Intensive Functions Case Study: Vector Quantization," *1998 IEEE*, No. 0–7803–2123–5/94, 10 pgs [1637–1646].

Lidsky, D. and Rabaey J.M. (1996) "Early Power Exploration—A World Wide Web Application," *ACM, Inc., 33rd Design Automation Conference*, DAC96–06/96, ACM 0–89791–779–0/96/0006, 6 pgs [1621–1626].

Lidsky, D. and Rabaey, J.M. (1994) "Low–Power Design of Memory Intensive Functions," *1994 IEEE Symposium on Low Power Electronics*, No. 2.4, 2 pgs [1647–1648].

Liffring, Mark (1985) "Spice Compatible Sampled–Data Models for Switching Regulators," *Society of Automotive Engineers, Inc.*, SAE/P–85/164, 6 pgs [1649–1654].

Linear Technology (1993) "High Efficiency Synchronous Step–Down Switching Regulators," (product description brochure) LTC1148, LTC1148–3.3/LTC1148–5, 2 pgs [1273–1274].

Liu et al. (2000) "Chip–Scale Packaging of Power Devices and its Application in Integrated Power Electronics Modules," *2000 IEEE*, Electronic Components and Technology Conference, No. 0–7803–5911–9/00, 8 pgs.

Liu, Xingsheng (2001) "Processing and Reliability Assessment of Solder Joint Interconnection for Power Chips," Dissertation submitted to Virginia Polytechinc Institute and State University, Feb. 27, 2001, pp.i–xxvii and 1–265.

Liu, Xingsheng, et al. "Chip–Scale Packaging of Power Devices and Its Application in Integrated Power Electronics Modules," IEEE Transactions on Advanced Packaging, vol. 24, No. 2, May 2001, 1521–3323(01)04492–6. 10 pgs. Downloaded on May 5, 2009.

Liu, Xingsheng, et al. "Three–Dimensional Flip–Chip on Flex packaging for Power Electronics Applications," IEEE Transactions on Advanced Packaging, vol. 24, No. 1, Feb. 2001, 1521–3323(01)00558–5. 9 pgs. Downloaded on May 4, 2009.

Loriferne, Bernard (1982) "Analog–Digital and Digital–Analog Conversion," *Heyden & Son, Ltd.*, No. ISBN 0–85501–497–0, 4 pgs [1655–1658].

Mao, R.S. et al. (1992) "A New On–Chip Voltage Regulator for High Density CMOS DRAMS," *1992 Symposium on VLSI Circuits Digest of Technical Papers*, 11–2, 1992 IEEE, 92CH3173–2/92/0000–0108, 2 pgs [1659–1660].

Martin, T.W. and Ang, S.S. (1995) "Digital Control for Switching Converters," *IEEE Symposium on Industrial Electronics*, vol. 2 of 2, Jul. 10–14, 1995, 6 pgs [1661–1666].

Maxim (1994) "Triple–Output Power–Supply controller for Notebook computers," MAX782, Maxim Integrated Products (brochure) 19–0146; Rev. 2, Jun. 1997, 2 pgs [1300–1301].

Maxim (1997) "High –Speed Step–Down Controllers with Synchronous Rectification for CPU Power," MAX1624/MAX1625, Maxim Integrated Products (brochure) 19–1227; Rev. 1, Jun. 1997, 25 pgs [1275–1299].

Miller, L. F. (1969) "Controlled Collapse Reflow Chip Joining*," IBM Components Division Laboratory, East Fishkill, NY, May 1969, pp. 239–250. 12 pgs.

Mitchell, Daniel (1988) "DC–DC Switching Regulator Analysis," Basic Switching Regulator Topologies, p. 9, ISBN 0–07–042597–3, McGraw Hill, Inc., 1988, 3 pgs [1667–1669].

Motorola (1996) "DC–to–DC Converter Control Circuits," Motorola, Inc. ((product description brochure) MC34063 A/D, MC33063A, Rev. 5, 13 pgs [1302–1314].

Narayanaswamy, S. et al. (1996) "A low–power, lightweight unit to provide ubiquitous information access Application and Network Support for InfoPad," *IEEE Personal communications*, Apr. 1996, 4–17, 14 pgs [913–926].

Nelson, Carl (1986) "LT1070 Design Manual," Linear Technology Application Note 19, Jun. 1986, No. AN19–1, 3 pgs [856–858].

Paulasto, Mervi and Hauck, Torsten, "Flip Chip Die Attach Development for Multichip Mechatronics Power Packages," Motorola GmbH, Advanced Interconnect Systems Laboratory—Europe, Munchen, Electronics Manufacturing Technology Symposium, 1999. Twenty–Fourth IEEE/CPMT, Oct. 18, 1999–Oct. 19, 1999. 0–7803–5502–4/99. 7 pgs. Downloaded on May 5, 2009.

Pehlke, D.R. et al. (1997) "Extremely High–Q Tunable Inductor for Si–Based RF Integrated Circuit Applications," *1997 IEEE, 64 IEDM 97–63, 3.4.1*, Dec. 7–10, 1997, 4 pgs [927–930].

Pehlke, D.R. et al. (1998) "High–Frequency Application of MOS Compact Models and their Development for Scalable RF Model Libraries," *1998 IEEE Custom Integrated Circuits Conference*, 1998, 219–222, 4 pgs [931–934].

Pienimaa, S. and Martin, N. (2001) "High Density Packaging for Mobile Terminals," *2001 IEEE*, Electronic Components and Technology Conference, No. 0–7803–7038–4/01, 8 pgs.

Poulton, Ken et al. (2002) "A 4GSample/s 8b ADC in 0.35 μm CMOS," *2002 IEEE International Solid–State Circuits Conference*, 2002, Session 10, High–Speed SDCs, 10.1, 3 pgs [889–891].

Poulton, Ken et al. (2002) "A 4GSample/s 8b ADC in 0.35 μm CMOS," 2002 IEEE International Solid–State Circuits Conference, 2002, Session 10, High–Speed SDCs, 10.1, Visuals Supplement, 5 pgs [953–957].

Razavi, Behzad (1995) "Principles of Data Conversion System Design," *IEEE Circuits and Systems Society, IEEE Press*, No. PC4465, 5 pgs [1676–16080].

Rinne et al. (2002) "Electromigration in WLCSP Solder Bumps," Unitive, Inc., Research Triangle Park, North Carolina. International symposium on microelectronics, Denver Colorado, Apr. 9, 2002, vol. 4931, pp. 662–667. 6 pgs.

Saint, Christopher and Judy (2002) "IC Layout Basis, A Practical Guide," *McGraw–Hill*, No. ISBN 0–07–138625–4, 5 pages [1681–1685].

Schiffer et al. (1998) "An Active Charge–Cancellation System for Switched–Capacitor Sensor Interface Circuits," *IEEE ISSCC98*, Session 17, Sensor Technology, SA 17.2, 2 pgs [911–912].

Schiffer, Brian et al. (1998) An Active Charge Cancellation System for Switched–Capacitor Sensor Interface Circuits, *IEEE Journal of Solid–State Circuits*, vol. 33, No. 12, Dec. 1998, 2134–2137, 5 pgs [906–910].

Schofield, Hazel, et al. "FlipFET™ MOSFET Design for High Volume SMT Assembly," International Rectifier. 6 pgs.

Seitzer, Dieter et al. (1983) "Electronic Analog–to–Digital Converters," *John Wiley & Sons*, No. ISBN 0 471 90198.9, 3 pgs [1690–1692].

Severns, R.P. and Bloom, Ed (1985) "Modern DC–To–DC Switchmode Power Converter Circuits," *Van Nostrand Reinhold Company*, No. ISBN: 0–442–211396–4, 4 pgs [1693–1696].

Sherman, J.D. and Walters, M. (1996) "Synchronous Rectification: Improving the Efficiency of Buck Converter," *EDN.com*, Mar. 14, 1996, archives at http://www.edn.com/archives/1996/031496/06df4.htm, No. EDN–03.14.96, 5 pgs [1697–1701].

Soman, Vijay (1998) "Thermal Design Considerations–EL75XX," Intersil, Application Note, Mar. 20, 1998, No. AN1096, 6 pgs [834–839].

Sprock, Doug and Hsu, Ping (1997) "Predictive Discrete Time Control of Switch–mode Applications," Dept. of Elec. Eng., 1997 IEEE, pp. 175–181, No. 0–7803–3840–5/97, 7 pgs [1702–1708].

Stratakos et al., "DC Power Supply Design in Portable Systems," Electronics Research Laboratory, Memorandum No. MCB/ERL M95/4, Jan. 19, 1995 (Revised Apr. 26, 1995), pp. 1–62.

Stratakos, et al. (1994) "A Low–Voltage CMOC DC–DC Converter for a Portable Battery–Operated System," 1994 IEEE, No. 0–7803–1859–5/94, 619–626, 8 pgs [1722–1729].

Stratakos, et al., Coauthored Chapter 5, "DC Power Supply Design in Portable Systems," University of California, Berkeley, pp. 141–180, in Chandrakasan, Anantha P. and Brodersen, Robert W., Low Power Digital CMOS Design, Kluwer Academic Publishers, Norwell, MA, USA, 1995. ISBN 079239576X, 40 pages.

Takamura et al. (2000) "Low–thermal–resistance Flip–chip Fine Package For 1–W Voltage Regulator IC," *2000 IEEE/CPMT*, Intn'l Electronics Manufacturing Technology Symposium, No. 0–7803–6482–1/00, pp. 305–310. 6 pgs.

Taketani et al. (1996) "CSP with LOC Technology," Hitachi Cable Ltd, Hitachi–shi Ibaraki–ken, Japan. Proc. Proceedings of SPIE—the International Soceity for Optical Engineering; v. 2920, Proceedings of the 1996 International Symposium on Microelectronics. Oct. 1996. 6 pgs.

Texas Instruments, Inc. (1999) "Low–Dropout Voltage Regulators with Integrated Delayed Reset Function," TPS7301Q, TPS7325Q, TPS7330Q, TPS7333Q, TPS7348Q, TPS7350Q, SLVS124F–6/95, Production Data (brochure), Jan. 1999, 46 pgs [1315–1360].

Tsui et al. (2000) "Advanced Packaging Technologies in MOSFETs For Power Management," *2000 IEEE*, Electronic Components and Technology Conference, No. 0–7803–5911–9/00, 4 pgs.

Wan, Marlene et al. (1998) "An Energy Conscious Methodology for Early Design Exploration of Heterogeneous DSPs," 1998 IEEE Custom Integrated Circuits Conference, Sec 7.1.1, 8 pgs [1613–1620].

Williams, Jim and Huffman, Brian (1988) "Switched–capacitor networks simplify dc–dc converter designs (technical)," *EDN*, retrieved from the Internet at http://www.highbeam.com/Doc Print.aspc/DocID=1G1:7220705, downloaded Nov. 18, 2008, 3 pgs [4833–4835].

Williams, Richard and Blattner, Robert (1993) "Benefits of DMOS Voltage Scaling on Synchronous Buck regulator Efficiency," 1993 IEEE, No. 0–7803–1313–5/93/0000–146–151, 146–151, 6 pgs [4827–4832].

Wong, Mike (1998) Designing a high Efficiency DC–DC Converter with the EL75XX, Intersil, Application Note, Mar. 24, 1998, No. AN1101, 16 pgs [840–855].

Zhou, Xunwei (1999), "Low–voltage High–efficiency Fast–transient Voltage Regulator Module," Dissertation submitted to Virginia Polytechnic Institute and State University, Jul. 1999, pp. i–xiv and 1–211 (226 pgs).

* cited by examiner

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 9-11, 13, 15-19, 21-24, and 26-28 is confirmed.

New claims 34-101 are added and determinded to be patentable.

Claims 1-8, 12, 14, 20, 25, and 29-33 were not reexamined.

34. *The voltage regulator of claim 9, wherein a first portion of the control circuit is included in the first flip-chip type integrated circuit chip.*

35. *The voltage regulator of claim 34, wherein the first portion of the control circuit included in the first flip-chip type integrated circuit chip comprises circuitry for measuring a characteristic of the first flip-chip type integrated circuit chip.*

36. *The voltage regulator of claim 35, wherein the characteristic of the first flip-chip type integrated circuit chip is a current through the first power switch.*

37. *The voltage regulator of claim 35, wherein the first flip-chip type integrated circuit chip further includes a second power switch to alternately couple and decouple the output terminal to ground, and wherein the characteristic of the first flip-chip type integrated circuit chip is current through the second power switch.*

38. *The voltage regulator of claim 34, wherein a second portion of the control circuit is included in a second integrated circuit chip.*

39. *The voltage regulator of claim 38, wherein the second integrated circuit chip is wire bonded.*

40. *The voltage regulator of claim 38, wherein the second integrated circuit chip is a second flip-chip type integrated circuit chip.*

41. *The voltage regulator of claim 38, wherein the first portion of the control circuit included in the first flip-chip type integrated circuit chip includes a sensor that directs measurements to the second portion of the control circuit included in the second integrated circuit chip.*

42. *The voltage regulator of claim 38, wherein the first portion of the control circuit included in the first flip-chip type integrated circuit chip includes an interpreter to interpret commands from the second portion of the control circuit included in the second integrated circuit chip.*

43. *The voltage regulator of claim 38, wherein the second portion of the control circuit included in the second integrated circuit chip includes a feedback circuit and a pulse modulator, and wherein the pulse modulator is coupled to the first flip-chip type integrated circuit chip.*

44. *The voltage regulator of claim 43, wherein the feedback circuit includes circuitry which measures a first voltage, the measured voltage being used to control the pulse modulator.*

45. *The voltage regulator of claim 44, wherein the first voltage is the output voltage.*

46. *The voltage regulator of claim 9, further comprising:*
*a first plurality of metalized pads formed over the first and second plurality of doped regions, wherein the first plurality of metalized pads are coupled to the first plurality of doped regions; and*
*a second plurality of metalized pads formed over the first and second plurality of doped regions, wherein the second plurality of metalized pads are coupled to the second plurality of doped regions.*

47. *The voltage regulator of claim 46, wherein the first plurality of doped regions and the second plurality of doped regions are arranged as parallel stripes.*

48. *The voltage regulator of claim 47, wherein at least a first subset of the first plurality of metalized pads forms a row which is orthogonal to the stripes of doped regions.*

49. *The voltage regulator of claim 46, wherein the first plurality of doped regions and the second plurality of doped regions are arranged in a checkerboard pattern.*

50. *The voltage regulator of claim 46, wherein the first flip-chip type integrated circuit chip further includes a second power switch to alternately couple and decouple the output terminal to ground, the second power switch including a third plurality of doped regions and a fourth plurality of doped regions in the chip substrate;*
*wherein the first plurality of metalized pads are coupled between the first plurality of doped regions and the input terminal of the voltage regulator, and the second plurality of metalized pads are coupled between the second plurality of doped regions and output terminal of the voltage regulator; and*
*the voltage regulator further comprising:*
*a third plurality of metalized pads formed over the third and fourth plurality of doped regions, wherein the third plurality of metalized pads are coupled between the third plurality of doped regions and the output terminal of the voltage regulator; and*
*a fourth plurality of metalized pads formed over the third and fourth plurality of doped regions, wherein the fourth plurality of metalized pads are coupled between the fourth plurality of doped regions and ground.*

51. *The voltage regulator of claim 50, further comprising a fifth plurality of metalized pads connected to a portion of the control circuit included in the first flip-chip type integrated circuit chip.*

52. *The voltage regulator of claim 51, wherein the fifth plurality of metalized pads is fewer than the sum of the number of metalized pads in the first, second, third, and fourth pluralities of metalized pads.*

53. *The voltage regulator of claim 52, wherein there are no metalized pads other than the first, second, third, fourth and fifth pluralities of metalized pads.*

54. *The voltage regulator of claim 51, wherein the first, second, third and fourth pluralities of metalized pads occupy a first area of the first flip-chip type integrated circuit chip, and the fifth plurality of metalized pads occupies a second area of the first flip-chip type integrated chip, wherein the first area is adjacent the second area.*

55. *The voltage regulator of claim 54, wherein there are no metalized pads between the first area and a first edge of the first flip-chip type integrated circuit chip, or between the first area and a second edge of the first flip-chip type integrated circuit chip, or between the first area and a third edge of the first flip-chip type integrated circuit chip.*

56. *The voltage regulator of claim 55, wherein the second area is between the first area and a fourth edge of the first flip-chip type integrated circuit chip.*

57. The voltage regulator of claim 50, wherein the first plurality of doped regions and the second plurality of doped regions form parallel stripes and a portions of the gate region separates each of the parallel stripes of the first plurality of doped regions from the parallel stripes of the second plurality of doped regions.

58. The voltage regulator of claim 50, wherein the second and third pluralities of metalized pads are coupled to the output terminal via an inductor.

59. The voltage regulator of claim 58, wherein:
the first plurality of metalized pads includes a first row of metalized pads;
the second plurality of metalized pads includes a second row of metalized pads;
the third plurality of metalized pads includes a third row of metalized pads; and
the fourth plurality of metalized pads includes a fourth row of metalized pads.

60. The voltage regulator of claim 59, further comprising a first plurality of solder balls connected to the first row of metalized pads; a second plurality of solder balls connected to the second row of metalized pads; a third plurality of solder balls connected to the third row of metalized pads; and a fourth plurality of solder balls connected to the fourth row of metalized pads.

61. The voltage regulator of claim 58, wherein the first and second pluralities of metalized pads form a first evenly spaced array, and the third and fourth pluralities of metalized pads form a second evenly spaced array.

62. The voltage regulator of claim 58, wherein the metalized pads are square.

63. The voltage regulator of claim 58, wherein the metalized pads are circular.

64. The voltage regulator of claim 58, wherein the metalized pads are octagonal.

65. The voltage regulator of claim 58, wherein:
each of the first plurality of metalized pads extends over more than one of the first plurality of doped regions and over more than one of the second plurality of doped regions;
each of the second plurality of metalized pads extends over more than one of the first plurality of doped regions and over more than one of the second plurality of doped regions;
each of the third plurality of metalized pads extends over more than one of the third plurality of doped regions and over more than one of the fourth plurality of doped regions; and
each of the fourth plurality of metalized pads extends over more than one of the third plurality of doped regions and over more than one of the fourth plurality of doped regions.

66. The voltage regulator of claim 65, wherein the first flip-chip type integrated circuit chip further comprises at least three metal layers formed over the first plurality of doped regions, the second plurality of doped regions, the third plurality of doped regions and the fourth plurality of doped regions.

67. The voltage regulator of claim 46, wherein:
each of the first plurality of metalized pads extends over more than one of the first plurality of doped regions and over more than one of the second plurality of doped regions; and
each of the second plurality of metalized pads extends over more than one of the first plurality of doped regions and over more than one of the second plurality of doped regions.

68. The voltage regulator of claim 46, wherein a third plurality of metalized pads are connected to a portion of the control circuit included in the first flip-chip type integrated circuit chip.

69. The voltage regulator of claim 68, wherein the third plurality of metalized pads do not extend over any of the first plurality of doped regions or any of the second plurality of doped regions.

70. The voltage regulator of claim 68, wherein the third plurality of metalized pads are provided along an edge of the first flip-chip type integrated circuit chip.

71. The voltage regulator of claim 9, wherein the first flip-chip type integrated circuit chip is mounted on the printed circuit board such that a current path extending from the first flip-chip type integrated circuit chip to the printed circuit board is located entirely beneath the first flip-chip type integrated circuit chip.

72. The voltage regulator of claim 71, wherein the current path extends through one or more conductive elements.

73. The voltage regulator of claim 72, wherein the one or more conductive elements includes one or more of: a solder ball, a portion of a signal layer, or a via.

74. The voltage regulator of claim 71, wherein the first flip-chip type integrated circuit chip further includes a second power switch, the second power switch including a third plurality of doped regions and a fourth plurality of doped regions;
and wherein the voltage regulator further comprises:
a first electrode that couples the first plurality of doped regions to the input terminal;
a second electrode that couples the second plurality of doped regions and the third plurality of doped regions to the output terminal; and
a third electrode that couples the fourth plurality of doped regions to ground.

75. The voltage regulator of claim 74, wherein the first electrode comprises at least one finger, the second electrode comprises at least one finger, and the third electrode comprises at least one finger; and
wherein the fingers of the first, second, and third electrodes are parallel to each other.

76. The voltage regulator of claim 75, wherein the fingers of the first, second and third electrodes are aligned with solder balls disposed across a surface of the first flip-chip type integrated circuit chip.

77. The voltage regulator of claim 75, wherein the fingers of the first, second and third electrodes are aligned with pads disposed across a surface of the first flip-chip type integrated circuit chip.

78. The voltage regulator of claim 77, wherein the pads are coupled to respective ones of pluralities of doped regions.

79. The voltage regulator of claim 74, wherein the first electrode, the second electrode, and the third electrode are on the printed circuit board.

80. The voltage regulator of claim 74, wherein the first electrode, the second electrode, and the third electrode are in a signal layer that is interposed between the first flip-chip type integrated circuit chip and the printed circuit board.

81. The voltage regulator of claim 80, wherein the signal layer is on an interposer substrate.

82. The voltage regulator of claim 74, wherein one or more of the first electrode, the second electrode, or the third electrode includes a first plurality of electrode fingers.

83. The voltage regulator of claim 82, wherein the first plurality of electrode fingers are interdigited with a second plurality of electrode fingers.

84. The voltage regulator of claim 83, further comprising:
a first row of solder balls, a second row of solder balls, a third row of solder balls, and a fourth row of solder balls disposed across a surface of the first flip-chip type integrated circuit chip;
wherein a first electrode finger of the first plurality of electrode fingers is aligned with the first row of solder balls, wherein a second electrode finger of the first plurality of electrode fingers is aligned with the second row of solder balls, wherein a first electrode finger of the second plurality of electrode fingers is aligned with the third row of solder balls, and wherein a second electrode finger of the second plurality of electrode fingers is aligned with the fourth row of solder balls.

85. The voltage regulator of claim 74, wherein one or more of the first electrode, the second electrode, or the third electrode further comprises a first electrode body and a first plurality of electrode fingers.

86. The voltage regulator of claim 85, wherein the first plurality of electrode fingers extend towards a second electrode body and a second plurality of electrode fingers extend towards the first electrode body.

87. The voltage regulator of claim 74, further comprising a plurality of control electrodes that are coupled to a portion of the control circuit included in the first flip-chip type integrated circuit chip.

88. The voltage regulator of claim 87, wherein the plurality of control electrodes are on the printed circuit board.

89. The voltage regulator of claim 87, wherein the plurality of control electrodes are in a signal layer that is interposed between the first flip-chip type integrated circuit chip and the printed circuit board.

90. The voltage regulator of claim 89, wherein the signal layer is on a substrate between the printed circuit board and the first flip-chip type integrated circuit chip.

91. The voltage regulator of claim 74, further comprising:
a first plurality of solder balls coupled between the first electrode and the first plurality of doped regions;
a second plurality of solder balls coupled between the second electrode and the second and third pluralities of doped regions; and
a third plurality of solder balls coupled between the third electrode and the fourth plurality of doped regions.

92. The voltage regulator of claim 91, further comprising:
a first plurality of metalized pads coupled between the first plurality of solder balls and the first plurality of doped regions;
a second plurality of metalized pads coupled between first ones of the second plurality of solder balls and the second plurality of doped regions;
a third plurality of metalized pads coupled between second ones of the second plurality of solder balls and the third plurality of doped regions; and
a fourth plurality of metalized pads coupled between the third plurality of solder balls and the fourth plurality of doped regions.

93. The voltage regulator of claim 92, wherein:
the first plurality of solder balls are aligned with the first plurality of metalized pads;
the second plurality of solder balls are aligned with the second and third pluralities of metalized pads; and
the third plurality of solder balls are aligned with the fourth plurality of metalized pads.

94. The voltage regulator of claim 91, wherein the first flip-chip type integrated circuit chip includes a final metal layer, and an under-bump metalization (UBM) layer coupled between the final metal layer and the solder balls.

95. The voltage regulator of claim 91, wherein:
the first electrode comprises at least a first finger, the second electrode comprises at least a second finger, and the third electrode comprises at least a third finger; and
wherein the first finger is aligned with at least a subset of the first plurality of solder balls;
the second finger is aligned with at least a subset of the second plurality of solder balls; and
the third finger is aligned with at least a subset of the third plurality of solder balls.

96. The voltage regulator of claim 71, wherein the first flip-chip type integrated circuit chip is mounted directly on the printed circuit board.

97. The voltage regulator of claim 96, further comprising an input capacitor coupled between the input terminal and ground wherein the input capacitor is mounted directly on the printed circuit board.

98. The voltage regulator of claim 71, wherein the first flip-chip type integrated circuit chip is mounted on the printed circuit board through a signal layer disposed between the first flip-chip type integrated circuit chip and the printed circuit board.

99. The voltage regulator of claim 98, wherein the signal layer is on a substrate between the printed circuit board and the first flip-chip type integrated circuit chip.

100. The voltage regulator of claim 98, wherein the filter comprises an inductor and an output capacitor that are mounted directly on the printed circuit board.

101. The voltage regulator of claim 98, further comprising an input capacitor coupled between the input terminal and ground, wherein the input capacitor is mounted directly on the printed circuit board.

* * * * *